(12) United States Patent
Konrath et al.

(10) Patent No.: US 11,063,142 B2
(45) Date of Patent: Jul. 13, 2021

(54) SEMICONDUCTOR DEVICE INCLUDING SILICON CARBIDE BODY AND METHOD OF MANUFACTURING

(71) Applicant: Infineon Technologies AG, Neubiberg (DE)

(72) Inventors: Jens Peter Konrath, Villach (AT); Wolfgang Bergner, Klagenfurt (AT); Christian Hecht, Buckenhof (DE); Hans-Joachim Schulze, Taufkirchen (DE); Andre Rainer Stegner, Unterhaching (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 38 days.

(21) Appl. No.: 16/721,088

(22) Filed: Dec. 19, 2019

(65) Prior Publication Data

US 2020/0203513 A1 Jun. 25, 2020

(30) Foreign Application Priority Data

Dec. 21, 2018 (DE) .......................... 102018133433.8

(51) Int. Cl.
*H01L 29/739* (2006.01)
*H01L 29/16* (2006.01)
*H01L 29/32* (2006.01)
*H01L 29/40* (2006.01)
*H01L 29/66* (2006.01)
*H01L 21/04* (2006.01)
*H01L 29/47* (2006.01)

(52) U.S. Cl.
CPC ...... *H01L 29/7397* (2013.01); *H01L 21/0455* (2013.01); *H01L 29/1608* (2013.01); *H01L 29/32* (2013.01); *H01L 29/401* (2013.01); *H01L 29/47* (2013.01); *H01L 29/66068* (2013.01)

(58) Field of Classification Search
CPC .. H01L 29/1095; H01L 29/1608; H01L 29/32
See application file for complete search history.

(56) References Cited

U.S. PATENT DOCUMENTS

| | | | |
|---|---|---|---|
| 8,154,026 B2 | 4/2012 | Ishii et al. | |
| 2016/0336390 A1 | 11/2016 | Hamada et al. | |
| 2018/0233564 A1 | 8/2018 | Kumada et al. | |
| 2020/0043823 A1* | 2/2020 | Nagaoka | H01L 29/0865 |

* cited by examiner

*Primary Examiner* — Daniel P Shook
(74) *Attorney, Agent, or Firm* — Cooper Legal Group, LLC

(57) ABSTRACT

A semiconductor device includes a silicon carbide body that includes a first section and a second section. The first section is adjacent to the second section. A drift region is formed in the first section and the second section. A lattice defect region is in a portion of the drift region in the second section. A first density of lattice defects, which include interstitials and vacancies in the lattice defect region, is at least double a second density of lattice defects, which include interstitials and vacancies in a portion of the drift region outside the lattice defect region.

20 Claims, 15 Drawing Sheets

SEMICONDUCTOR DEVICE INCLUDING SILICON CARBIDE BODY AND METHOD OF MANUFACTURING

RELATED APPLICATION

This application claims priority to German Patent Application No. 102018133433.8, filed on Dec. 21, 2018, entitled "SEMICONDUCTOR DEVICE INCLUDING SILICON CARBIDE BODY AND METHOD OF MANUFACTURING", which is incorporated herein.

TECHNICAL FIELD

The present disclosure is related to semiconductor devices, for example to silicon carbide semiconductor devices with transistor cells and/or Schottky contacts. The present disclosure is related to a method of manufacturing a semiconductor device that includes a silicon carbide body.

BACKGROUND

Power semiconductor devices are typically the switches and rectifiers in electric circuits for transforming electric energy, for example, in DC/AC converters, AC/AC converters or AC/DC converters and in electric circuits that drive heavy inductive loads, e.g., in motor driver circuits. The high dielectric breakdown field strength of silicon carbide (SiC) compared to silicon facilitates the application of SiC devices that are significantly thinner than equivalent silicon devices for the same nominal blocking voltage. On the other hand, electric parameters of silicon carbide devices tend to deteriorate at a higher rate than it is typically the case for equivalent silicon devices.

There is a need for improving long-term stability of silicon carbide device parameters.

SUMMARY

An embodiment of the present disclosure relates to a semiconductor device that includes a silicon carbide body with a first section and a second section. The first section is adjacent to the second section. A drift region is formed in the first section and the second section. A lattice defect region is in a portion of the drift region in the second section. A first density of lattice defects comprising interstitials and vacancies in the lattice defect region is at least double a second density of lattice defects comprising interstitials and vacancies in a portion of the drift region outside the lattice defect region.

An embodiment of the present disclosure relates to a method of manufacturing a semiconductor device. The method includes providing a silicon carbide substrate that includes a first section and a second section. The first section is adjacent to the second section. The silicon carbide substrate includes a drift layer in the first section and the second section. The method further includes forming a lattice defect region in a portion of the drift layer in the second section. A first density of lattice defects comprising interstitials and vacancies in the lattice defect region is at least double a second density of lattice defects comprising interstitials and vacancies in a portion of the drift layer outside the lattice defect region.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and a method of manufacturing a semiconductor device and together with the description serve to explain principles of the embodiments. Further embodiments are described in the following detailed description and the claims.

DETAILED DESCRIPTION

Figure 1:
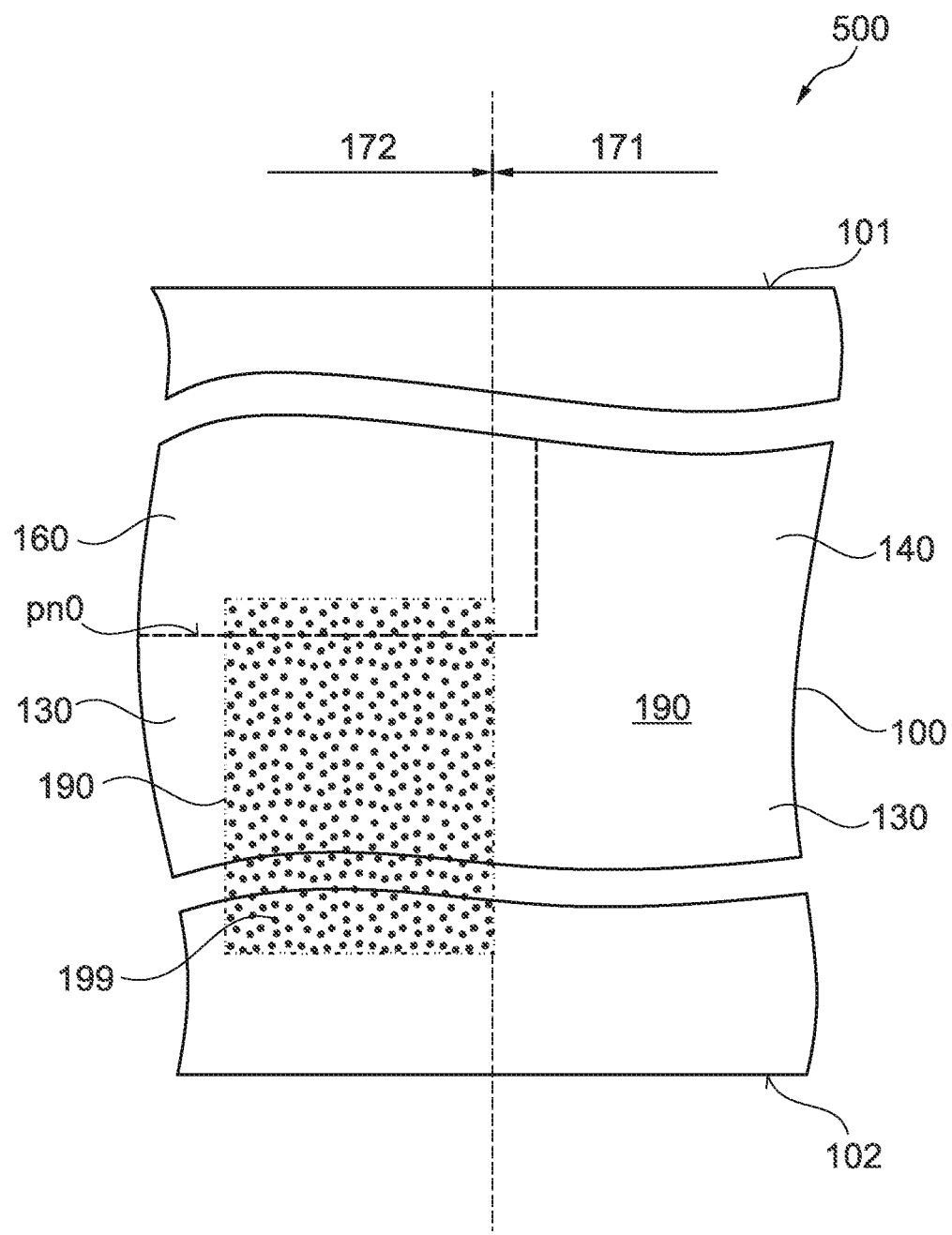
FIG. 1 illustrates a schematic vertical cross-sectional view of a portion of a semiconductor device with a lattice defect region according to an embodiment.

In the following detailed description, reference is made to the accompanying drawings, which form a part hereof and in which are shown by way of illustrations specific embodiments in which a semiconductor device and a method of manufacturing a semiconductor device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state.

A safe operating area (SOA) defines voltage and current conditions over which a semiconductor device can be expected to operate without self-damage. The SOA is given by published maximum values for device parameters like maximum continuous load current, maximum gate voltage and others.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

A conformal layer has a thickness that is substantially the same along an interface to a base on which the conformal layer is formed. A conformal layer may exhibit marginal thickness variations along edges, steps or other elements of the base, but is nevertheless considered a conformal layer if the magnitude of the thickness variations is low compared to a mean thickness of the conformal layer. A conformal layer may be formed by thin-film deposition methods such as CVD (chemical vapor deposition), plating, or ALD (atomic layer deposition).

Used in context with particles, the element name includes all relevant molecular entities of the element. For example, the term "hydrogen" may include hydrogen atoms, protons and/or gaseous hydrogen.

According to an embodiment, a semiconductor device includes a silicon carbide body that may include a first section and a second section, wherein the first section may be located adjacent to the second section. The first section and the second section may extend from a first surface of the silicon carbide body into the silicon carbide body. For example, the first section and the second section may extend from the first surface to an opposite second surface of the silicon carbide body through the complete silicon carbide body. In other words, the first section and the second section may be vertical slices of the silicon carbide body.

The silicon carbide body further includes a drift region, which is formed in the first section and the second section. Here, "formed in the first section and the second section" may mean that the drift region spans over the first section and the second section. A lattice defect region may be formed in a portion of the drift region in the second section of the silicon carbide body. The lattice defect region may be absent in the first section. Alternatively and/or additionally, the lattice defect region may be absent in at least a portion of the first section. A first density of lattice defects comprising interstitials and vacancies in the lattice defect region may be at least double a second density of lattice defects comprising interstitials and vacancies in a portion of the drift region outside the lattice defect region. For example, a maximum density of lattice defects in the lattice defect region may be at least ten times higher than a density of lattice defects outside the lattice defect region.

The lattice defects may include interstitials, vacancies and/or antisites. Each vacancy may be a solitary vacancy or the constituent of a complex. Each interstitial may be a solitary self-interstitial or may be the constituent of a complex. Each antisite may be a carbon atom at a silicon lattice site and/or a silicon atom at a carbon lattice site.

It is possible, that the total number of vacancies does not or not significantly exceed or fall below the total number of self-interstitials, wherein the crystal of the silicon carbide body is non-porous.

The drift region includes at least a drift zone that forms a voltage sustaining layer. In a blocking state of the semiconductor device a depletion region mainly extends into the drift zone. Vertical extension of and dopant concentration in the drift zone are selected such that the semiconductor device reaches its nominal blocking voltage capability. The drift region may include further doped regions of the conductivity type of the drift zone, e.g., a field stop layer, a buffer layer, a barrier layer, and/or others.

In at least one operational mode of the semiconductor device a bipolar current including holes and electrons flows through the drift region. The bipolar current passes at least a main pn junction and may pass further pn junctions and/or unipolar junctions. Especially in the vicinity of the pn junctions and the unipolar junctions of the drift region, holes and electrons may recombine at a more than insignificant rate. The recombination sets free thermal energy that may promote bipolar degradation. The term "bipolar degradation" denotes the growth of preexisting crystallographic defects. For example, BPD (basal plane dislocations) between neighboring lattice planes may transform into SSFs (Shockley stacking faults), which grow along the lattice planes. The lattice defects may grow into the drift region and may grow in a direction that is predominantly transversal to a vertical load current flow through the drift region such that the lattice defects may more and more impede the vertical load current flow through the drift region.

The preexisting lattice defects in the lattice defect regions may form recombination centers for free charge carriers such that the probability for the more critical direct recombination of electron/hole pairs is reduced. Alternatively or in addition, the preexisting lattice defects may stop the growth of stacking faults such that the growth of the SSFs ends at or within the lattice defect regions and cannot proceed through the lattice defect regions. In other words, the lattice defect regions form physical barriers against the propagation of lattice defects, for example, SSFs. The growth of the stacking faults can be confined to a narrow section of the drift region such that the lattice defect regions may limit the maximum degree of bipolar degradation.

According to an embodiment, the silicon carbide body may include an emitter region and a unipolar current region. The emitter region is a doped region in the second section of the silicon carbide body between the first surface and the drift region. The emitter region and the drift region may form a main pn junction. A bipolar current may flow across the main pn junction in at least one operational state of the semiconductor device at operation conditions within the SOA (safe operating area). At least at operation conditions within the SOA, no unipolar current flows through the emitter region. The emitter region may be or may include the anode region of a pn diode structure, a shielding region, and/or a portion of a body region and/or body well directly between a heavily doped body contact region and the drift region, by way of example.

The unipolar current region denotes a further doped region or a combination of doped regions in the first section of the silicon carbide body between the first surface and the drift region. The unipolar current region may include a body region of a transistor cell or a cathode region of a Schottky contact.

Through the unipolar current region, a unipolar current flows in at least one unipolar operational state of the semiconductor device at operation conditions within the SOA. In case a bipolar current flows through the silicon carbide body, at most a small portion (e.g. at most 30%, or at most 25%) of the total bipolar current flows through the unipolar current region. However, the greater portion of the bipolar current flows through the emitter region. It is also possible that no or almost no bipolar current flows through the unipolar current region at any operation condition within the SOA.

The unipolar current region may include, e.g., the cathode region of a Schottky contact, the complete or at least a portion of the body region of a field effect transistor cell with vertical channel or a portion of a body well of a planar transistor cell.

A lattice defect region selectively formed in the second section with the emitter region may efficiently confine the spreading of stacking faults at the source of bipolar degradation. The absence of the lattice defect regions in the first section with the unipolar current region may avoid the degradation of electrical parameters linked to crystal quality. For example, it may be possible that the lattice defect region does not increase the ohmic resistance of portions of the drift region through which a main portion of a unipolar load current or a main portion of a unipolar Schottky diode forward current flows.

According to an embodiment, the lattice defect region may include an upper defect region, wherein the upper defect region may be in a part of the drift region within a threshold distance of the main pn junction. For example, the upper defect region may be in a part of the drift region along and/or close to the main pn junction. The lattice defect region is close to the main pn junction, if a distance between the lattice defect region and the main pn junction is smaller than a distance between the main pn junction and the first surface of the silicon carbide body.

Under forward bias of the main junction, the main junction may be a highly efficient source of hole injection into an n-doped drift region and may form a source area for significant bipolar degradation. The upper defect region of the lattice defect region may efficiently suppress the spreading of SSFs in the vicinity of the source area of bipolar degradation.

According to an embodiment, the upper defect region may overlap the main pn junction. The lattice defect region overlaps the main pn junction when the main pn junction is within the FWHM (full width at half maximum) of the lattice defect region. In other words: The lattice defect region overlaps the main pn junction if the number of lattice defects along the main pn junction is at least a half of the maximum number of lattice defects in the lattice defect region. The main pn junction may be the main source for stacking faults. A main pn junction that is located within the upper defect region may efficiently suppress the spreading of SSFs at an early stage.

According to an embodiment, the silicon carbide body may include a base portion between the second surface and the drift region. The base portion and the drift region may form a rear side junction. The rear side junction may be a pn junction or a unipolar junction. The lattice defect region may include a lower defect region in a part of the drift region within a threshold distance of the rear side junction. For example, the lower defect region may be in a part of the drift region along and/or close to the rear side junction.

The lattice defect region is close to the rear side junction if a distance between the lattice defect region and the rear side junction is smaller than a distance between the main pn junction and the first surface of the silicon carbide body.

The rear side junction may be a source area for bipolar degradation and starting point for SSFs. The lower defect region may effectively suppress the spreading of SSFs close to their origin.

According to an embodiment, the lower defect region may overlap the rear side junction. Since the rear side junction may be a source area for bipolar degradation, a lower defect region that overlaps the rear side junction may efficiently suppress the spreading of SSFs.

According to an embodiment, the lattice defect region may include a plurality of stripe portions. The lattice defect region may consist of the plurality of stripe portions. Each of the plurality of stripe portions may be stripe-shaped and may mainly extend along a horizontal direction (e.g. a first or second horizontal direction). Each of the plurality of stripe portions may further have a width in a direction perpendicular to the horizontal direction. The width of each stripe portion may be smaller (e.g. at least 10 times smaller) than an extent of the stripe portion in the horizontal direction.

The plurality of stripe portions may run in parallel to each other. Formation of parallel stripe portions may include application of a comparatively simple implant mask with stripes and stripe-shaped openings between the stripes.

According to an embodiment, the semiconductor device may include a plurality of stripe-shaped unipolar current regions. Each of the plurality of stripe-shaped unipolar current regions may extend along a first horizontal direction.

The width of the plurality of stripe portions can be easily adapted to the layout of emitter regions and unipolar current regions of the semiconductor device. For example, stripe-shaped lattice defect regions may get easily adjusted to stripe-shaped transistor cells or to transistor cells arranged in rows and columns, such that the lattice defect regions can be efficiently assigned to emitter regions and can efficiently spare unipolar current regions. For example, the lattice defect region may nearly completely spare the unipolar current regions and may be formed almost exclusively in the stripe-shaped emitter regions.

In some embodiments, the plurality of stripe portions of the lattice defect region run parallel to the plurality of stripe-shaped unipolar current regions. In other words: the horizontal direction along which each of the plurality of stripe portions extends corresponds to and/or runs parallel to the first horizontal direction. The plurality of stripe portions and the plurality of stripe-shaped unipolar current regions may both extend along the first horizontal direction.

According to an embodiment, the plurality of stripe portions of the lattice defect region run transverse to the plurality of stripe-shaped unipolar current regions. In other words: the horizontal direction along which each of the plurality of stripe portions extends runs transverse to the first horizontal direction. For example, the plurality of stripe portions may extend along a second horizontal direction. In this context, "transverse" may mean that the first and the second horizontal direction may enclose an angle of at least 1° and at most 90°. For example, the first horizontal direction may be orthogonal to the second horizontal direction.

The lattice defect region may spare large portions of the unipolar current regions, wherein a cross-sectional area of the spared portion of the unipolar current regions can be defined by the horizontal width of the plurality of stripe portions and the center-to-center distance between neighboring stripe portions. An alignment of the plurality of stripe portions to the unipolar current regions may become obsolete.

According to an embodiment, a plurality of unipolar current regions may be arranged in rows and columns. Further, the lattice defect region may form a grid with the plurality of unipolar current regions formed in meshes of the grid. The lattice defect region may overlap at a high degree with the emitter region, for example, with a grid-shaped emitter region. It is possible that the lattice defect region does not or only to a low degree adversely affect the plurality of unipolar current regions.

According to an embodiment, the first section may include the body region of a transistor cell. The body region may form a first pn junction with the drift region and a second pn junction with a source region. The transistor cell may include a gate electrode capacitively coupled to the body region. A potential applied to the gate electrode switches the transistor cell on and off by controlling the formation of an inversion channel between the first pn junction and the second pn section. A load current of the transistor cell is a unipolar current of the type of charge carriers that form the inversion channel. Where the lattice defect region is absent in the first section (and/or where the lattice defect region is absent in at least a portion of the first section), the lattice defect region does not adversely affect the electric parameters of the transistor cell.

According to an embodiment, the first section may include a Schottky contact. A Schottky contact is formed along an interface between a semiconductor material and a metal structure. The work function of the metal structure and the dopant concentration in the semiconductor material are selected such that in the absence of an externally applied electric field a depletion zone forms in the semiconductor material along the interface. Where the lattice defect region is absent in the first section (and/or where the lattice defect region is absent in at least a portion of the first section), the lattice defect region does not adversely affect the electric characteristics of the Schottky contact.

According to an embodiment, a method of manufacturing a semiconductor device includes providing a silicon carbide substrate that includes a first section and a second section. The first section may be adjacent to the second section. The first section and the second section may extend from a main surface of the silicon carbide substrate into the silicon carbide substrate. For example, the first section and the second section may extend through the complete silicon carbide substrate from the main surface to an opposite rear side surface of the silicon carbide substrate. In other words, the first section and the second section may be vertical slices of the silicon carbide substrate. The silicon carbide substrate may include a drift layer formed in the first section and the second section.

The method may further include forming a lattice defect region in a part of the drift layer in the second section of the silicon carbide substrate. The lattice defect region is not formed in at least a part of the first section. A first density of lattice defects including self-interstitials and vacancies in the lattice defect region is at least double a second density of lattice defects including self-interstitials and vacancies in a portion of the drift layer outside the lattice defect region.

According to an embodiment, forming the lattice defect region may include implanting hydrogen (H), helium (He) and/or argon (Ar) into the second section through a patterned implant mask. For example, H ions may be implanted at an area dose in a range from $5*10^{10}$ cm$^{-2}$ to $5*10^{13}$ cm$^{-2}$, for example, in a range from $10^{11}$ cm$^{-2}$ to $10^{13}$ cm$^{-2}$. The acceleration energy of implanted H ions may be in a range from 50 keV to 300 keV, e.g., from 100 keV to 220 keV, by way of example.

H, He and Ar can be implanted at comparatively low energies and at a comparatively late stage of processing, for example, after forming at least part of a front side metallization. The impact of H, He and/or Ar on other structures and doped regions in the silicon carbide substrate can be comparatively low.

According to an embodiment, a heat treatment may be performed that activates implanted dopants. A gate trench may be formed that extends from the main surface into the silicon carbide substrate with the activated implanted dopants. H, He and/or Ar may be implanted after the heat treatment and prior to forming the gate trench. The patterned implant mask for forming the lattice defect region can be formed at a stage, at which the main surface of the silicon carbide substrate is planar such that the implant mask can define the lattice defect region precisely and at high reproducibility.

The implant for forming the lattice defect region may be combined with an implant that at least partly defines an emitter region. For example, an implant for defining the emitter region and the implant defining the lattice defect region may be based on a generic implant mask.

According to an embodiment, a gate trench may be formed that extends from the main surface into the silicon carbide substrate. A gate dielectric layer may be formed along a sidewall of the gate trench. H, He and/or Ar may be implanted after forming the gate trench and prior to forming the gate dielectric layer such that the implantation is without adverse impact on a gate dielectric.

H, He and/or Ar may be implanted without further implantation mask, wherein the vertical implantation profile may follow the topography at the main surface. For example, in case a portion of the shielding region is formed below the gate trench, i.e., between the gate trench and the drift layer, the implanted H, He and/or Ar may reach the region of a pn junction between the shielding region and the drift layer even at comparatively low implant energies. In mesa portions of the silicon carbide substrate between the gate trenches, the implanted ions may come to rest in regions, in which the effect of the implanted ions on device characteristics is low.

Alternatively, the etch mask for forming the gate trenches or a mask derived from the etch mask (e.g. by the use of spacers or etching) may be used as an implant mask for the implant of H, He and/or Ar. The lattice defect region may be formed along the complete trench width. Alternatively, the patterned implant mask may prevent H, He and/or Ar from entering at least portions of the body regions of transistor cells and/or from entering at least portions of the doped cathode regions of Schottky contacts.

According to an embodiment, the method includes forming a first metal layer, such as a thin metal layer, on the main surface and a second metal layer, such as a thick metal layer, on the thin metal layer. The thick metal layer may be thicker than the thin metal layer. By implanting H, He and/or Ar prior to forming the thick metal layer, it is possible that the energy used for the implantation of the implanted ions can be comparatively low. As a consequence, lateral struggling of the implanted ions below the implant mask may be comparatively low and the lattice defect regions may be selectively formed with high reliability in the emitter regions. The implant mask may prevent H, He and/or Ar from entering critical portions of the gate dielectric of transistor cells and/or the Schottky contacts of MPS devices. The implant of H, He and/or Ar may include implants at one, two or more different implantation energies.

According to an embodiment, the method may include forming a thick metal layer on the main surface, wherein H, He and/or Ar may be implanted after forming the thick metal layer. For example, an implant mask for H, He and/or Ar may include stripes, which are tilted, for example, orthogonally tilted to stripe-shaped emitter regions. The resulting lattice defect region may include stripes that run transverse, for example, orthogonal to stripe-shaped emitter regions and orthogonal to stripe-shaped unipolar current regions such that a comparatively large lateral struggling of the implant has no or no significant impact on device characteristics. The cross-wise orientation of the stripe-shaped lattice defect region with respect to the stripe-shaped emitter regions and with respect to the unipolar current regions may stop the lateral growth of stacking faults close to the source area of bipolar degradation such that a loss of defect-free lattice area can be reduced to a significant degree.

FIG. 1 shows a portion of a semiconductor device 500 with a silicon carbide body 100. The semiconductor device 500 may be or may include an IGBT (insulated gate bipolar transistor), an IGFET (insulated gate field effect transistor), for example an MOSFET (metal oxide semiconductor FET), an MCD (MOS controlled diode) or an MPS (merged pin Schottky) diode, by way of example.

The silicon carbide body 100 may include or consist of single crystalline silicon carbide, e.g., a silicon carbide crystal including the main constituents silicon and carbon. The silicon carbide crystal may include unwanted impurities like H, oxygen and/or carbon and/or intended impurities, e.g., dopant atoms. The polytype of the silicon carbide crystal may be 15R or may be a hexagonal polytype, e.g. 2H, 6H, or 4H. The silicon carbide body 100 may include or consist of a silicon carbide layer grown by epitaxy.

A first surface 101 at a front side of the silicon carbide body 100 may be planar or ripped. A surface normal 104 orthogonal to a planar first surface 101 or orthogonal to a mean plane of a ripped first surface 101 defines a vertical direction. Directions orthogonal to the surface normal 104 are horizontal and lateral directions. The surface normal 104 may coincide with a main lattice direction or may be tilted to a main lattice direction by an off-axis angle, wherein the off-axis angle may be in a range from 2° to 8°. At the rear side of the silicon carbide body 100 a second surface 102 may extend parallel to a planar first surface 101 or to a mean plane of a ripped first surface 101.

The silicon carbide body 100 includes first sections 171 and second sections 172, wherein the first sections 171 and the second sections 172 alternate at least along one horizontal direction. Each first section 171 and each second section 172 may extend from the first surface 101 to the second surface 102. A drift region 130 laterally extends through the silicon carbide body 100 through the first sections 171 and the second sections 172.

The first sections 171 include unipolar current regions 140 between the first surface 101 and the drift region 130. The unipolar current regions 140 may laterally extend into the second sections 172.

The second sections 172 include emitter regions 160 between the first surface 101 and the drift region 130. The emitter regions 160 and the drift region 130 may form a main pn junction pn0. The emitter regions 160 may laterally extend into the first sections 171.

A lattice defect region 190 is selectively formed in the second sections 172, wherein at least a part of the lattice defect region 190 is formed within the drift region 130. The lattice defect region 190 may be absent in the first section 171. Alternatively and/or additionally, the lattice defect region 190 may be absent in at least a portion of the first section 171. The lattice defect region 190 may overlap the main pn junction pn0 or may overlap another junction between the drift region 130 and the second surface 102.

A first density of lattice defects 199 including interstitials, vacancies and/or antisites in the lattice defect region 190 is greater than a second density of lattice defects 199 comprising interstitials, vacancies and/or antisites outside the lattice defect region 190. For example, the first density of lattice defects 199 is at least two times, at least 10 times or at least 100 times greater than the second density of lattice defects 199. A total number of vacancies does not or not significantly exceed or fall below the total number of self-interstitials.

The lattice defect regions may have smooth vertical and lateral density distributions. Where the Figures show boundary lines of the lattice defect regions, the boundary lines may indicate FWHM (full width at half maximum) lines connecting points at which the density of lattice defects is half of the maximum lattice defect density in the lattice defect region.

FIGS. 2A-2D show portions of semiconductor devices 500 with a silicon carbide body 100, first sections 171, second sections 172, a drift region 130, unipolar current regions 140 and emitter regions 160 as described with reference to FIG. 1.

In the first sections 171 a plurality of transistor cells TC and/or Schottky contacts SC may be formed, wherein the transistor cells TC and/or the Schottky contacts SC may be electrically connected in parallel. Transistor cells TC and Schottky contacts SC may be combined in the same semiconductor device 500. According to other embodiments the semiconductor device 500 may include transistor cells TC and no Schottky contacts SC or may include Schottky contacts SC and no transistor cells TC. The unipolar current regions 140 may include body regions of the transistor cells TC and/or cathode regions of the Schottky contacts SC.

The emitter regions 160 may include anode regions of a pn diode electrically connected in parallel with Schottky contacts SC and/or may include shielding regions that shield at least portions of the transistor cells TC or the Schottky contacts SC against a potential applied to a load electrode at the rear side of the silicon carbide body 100.

The drift region 130 includes a drift zone 131 of a conductivity type opposite to that of the emitter regions 160. The drift zone 131 forms a voltage sustaining structure, wherein a vertical extension and a dopant concentration in the drift zone 131 may be selected such that the semiconductor device 500 provides a nominal blocking voltage capability in an off state of the semiconductor device 500. The emitter regions 160 and the drift zone 131 may form the main pn junction pn0. The drift zone 131 may be formed in a layer grown by epitaxy. A mean net dopant concentration in the drift zone 131 may be in a range from 1E15 cm$^{-3}$ to 5E16 cm$^{-3}$.

A heavily doped base portion 139 may be formed between the drift region 130 and the second surface 102 along the second surface 102. The heavily doped base portion 139 may be or may include a substrate portion obtained from a crystalline ingot or may be or may be formed from a heavily doped epitaxy layer. The base portion 139 may form an ohmic contact with a second load electrode 320 that directly adjoins the second surface 102. A dopant concentration in the base portion 139 along the second surface 102 is sufficiently high such that a low-resistive ohmic contact is formed between the base portion 139 and the second load electrode 320. The base portion 139 may have the same conductivity type as the drift zone 131 or the opposite conductivity type.

Source and body regions of the transistor cells TC, metal anodes of the Schottky contacts SC, and the emitter regions 160 may be electrically connected or coupled to a first load electrode 310, which may form or which may be electrically connected or coupled to a first load terminal L1. The second load electrode 320 may form or may be electrically connected or coupled to a second load terminal L2. Gate electrodes of the transistor cell TC may be electrically connected or coupled to a gate terminal G.

The first load terminal L1 may be an anode terminal of an MCD or MPS, a source terminal of an IGFET or an emitter terminal of an IGBT. The second load terminal L2 may be a cathode terminal of an MCD or MPS, a drain terminal of an IGFET or a collector terminal of an IGBT.

Figure 2A:
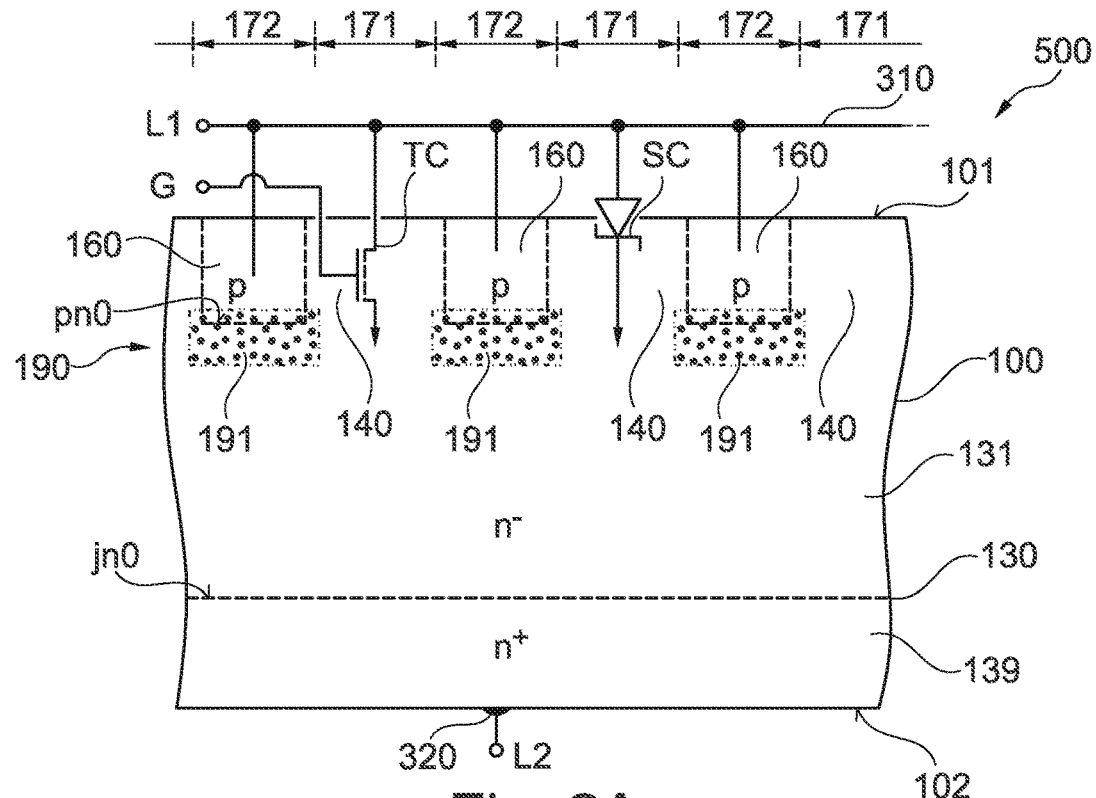
FIGS. 2A-2D illustrate schematic vertical cross-sectional views of portions of semiconductor devices according to embodiments with lattice defect regions in different portions of the drift zone.

In FIG. 2A the lattice defect region 190 includes upper defect regions 191 that overlap with the main pn junctions pn0. The lattice defect region 190 may be a horizontal layer structure, wherein the upper defect regions 191 may be laterally spaced sections of the horizontal layer structure.

Figure 2B:
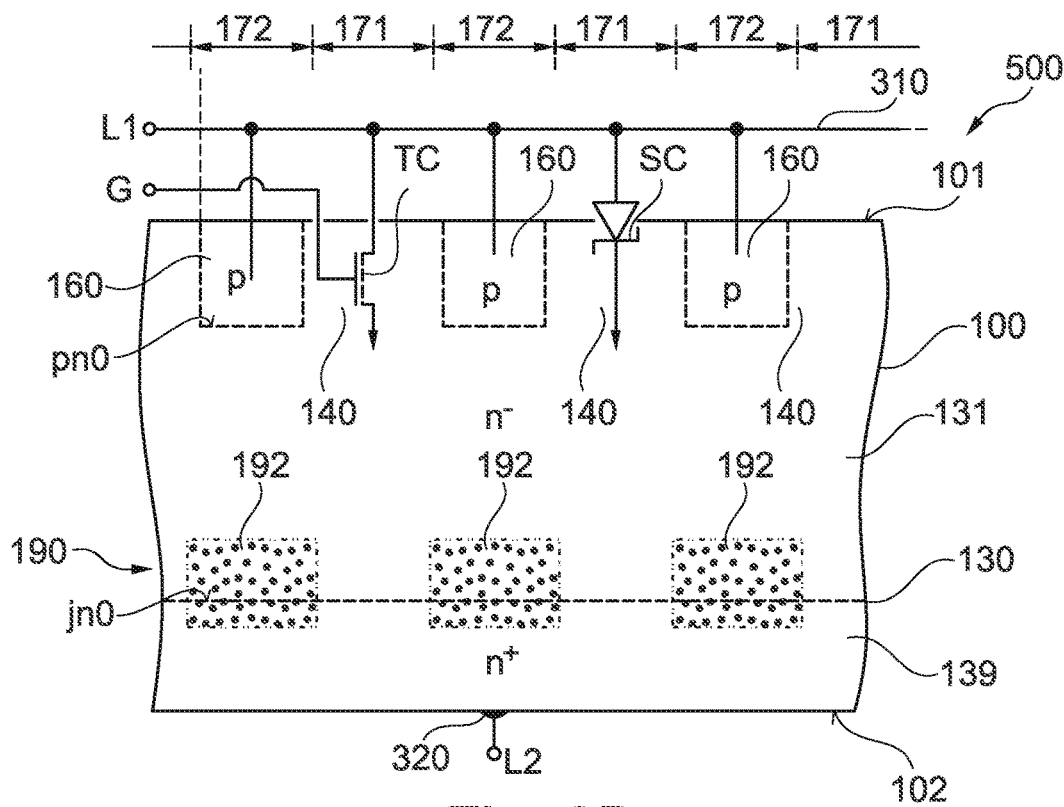

In FIG. 2B the lattice defect region 190 includes lower defect regions 192 that overlap with a rear side junction jn0, wherein the rear side junction jn0 is located between the drift zone 131 and the second surface 102. For example, the drift zone 131 and a doped region with the conductivity type of the drift zone 131 and, e.g., the base portion 139 may form a unipolar rear side junction jn0. The lattice defect region 190 may be a horizontal layer structure, wherein the lower defect regions 192 may be laterally spaced sections of the horizontal layer structure.

Figure 2C:
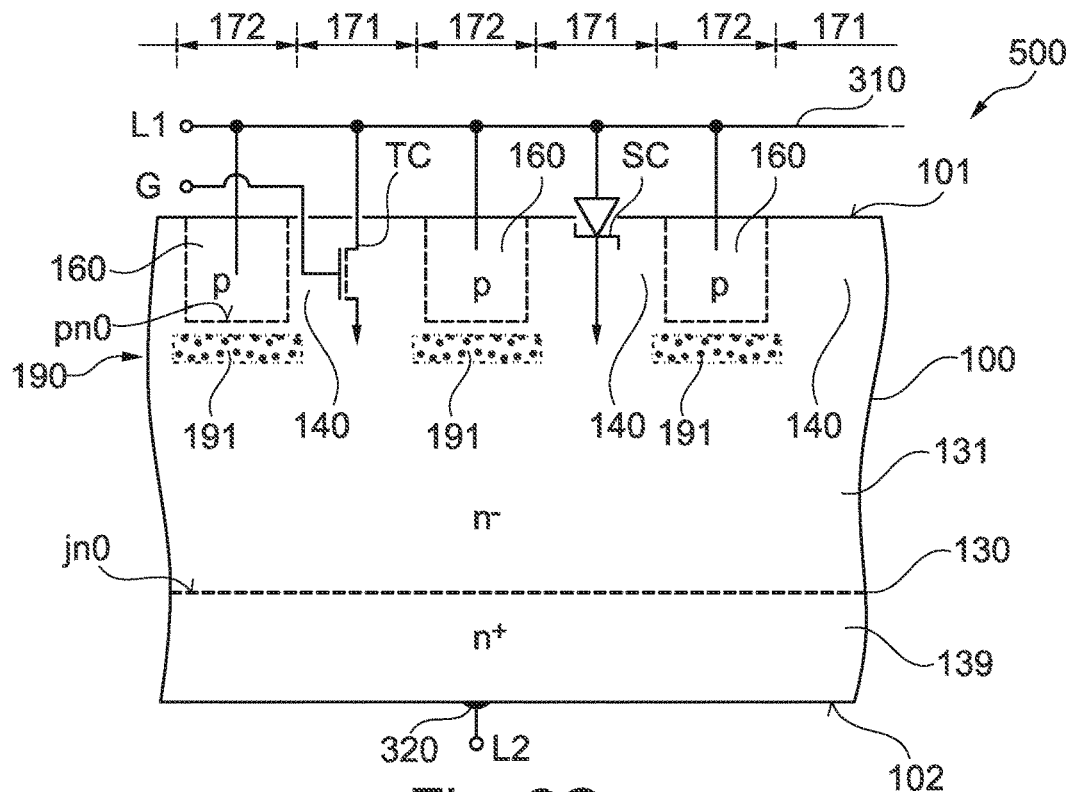

In FIG. 2C the upper defect region 191 is formed at a distance to the main pn junction pn0. The distance may be in the range of some ten nanometers.

Figure 2D:
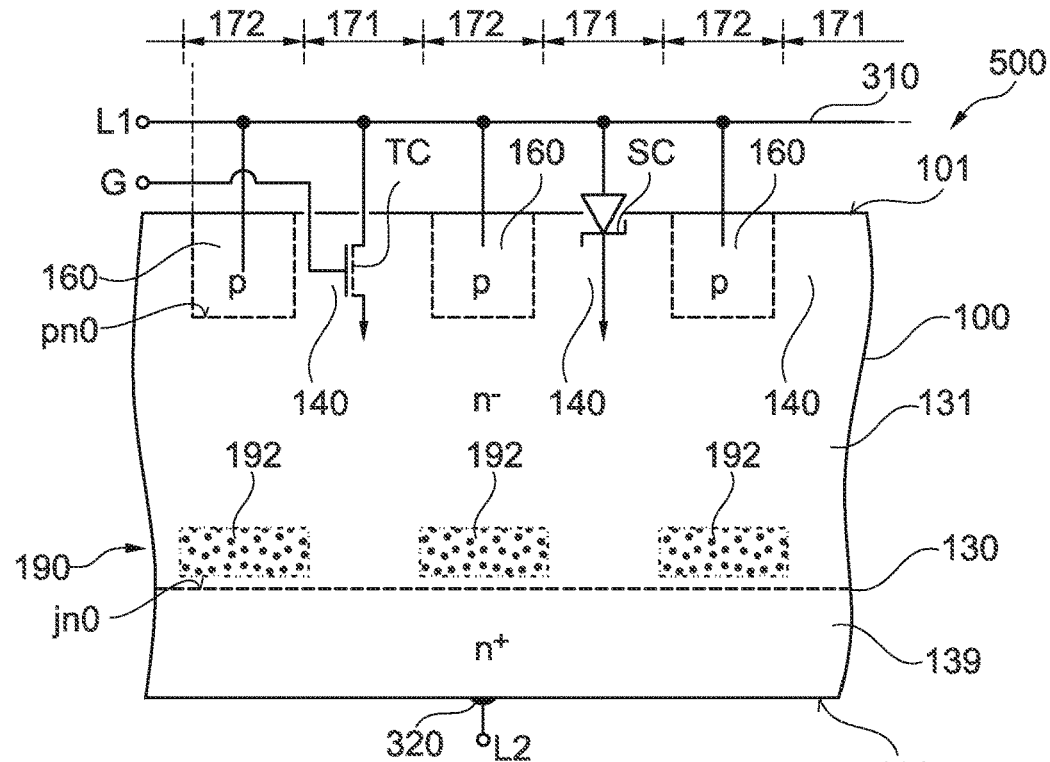

In FIG. 2D the lower defect region 192 is formed at a distance to the rear side junction jn0. The distance may be in the range of some ten nanometers.

FIGS. 3A-3E show positional relationships between the emitter regions 160, the second sections 172 and the lattice defect region 190 as described with reference to FIGS. 1-2D.

FIGS. 3A-3D refer to stripe-shaped emitter regions 160 that longitudinally extend along a first horizontal direction 291 and with a lateral first width w1. Stripe-shaped unipolar current regions 140 laterally separate neighboring emitter regions 160 from each other In FIG. 3A the lattice defect region 190 includes a plurality of stripe portions 195 with a horizontal longitudinal extension parallel to the first horizontal direction 291. Each stripe portion 195 is assigned to one emitter region 160. The first width w1 of the emitter regions 160 may be equal to, smaller than or greater than a lateral second width w2 of the plurality of stripe portions 195. For example, the second width w2 may be in a range from 0.5×w1 to 1.5×w1. The distance between neighboring stripe portions 195 defines the lateral width of the first sections 171. The longitudinal center axis of an emitter region 160 may coincide with a longitudinal center axis of the corresponding stripe portion 195. The plurality of stripe portions 195 of the lattice defect region 190 suppress to a high degree a spreading of stacking faults out of the second sections 172.

Figure 3A:
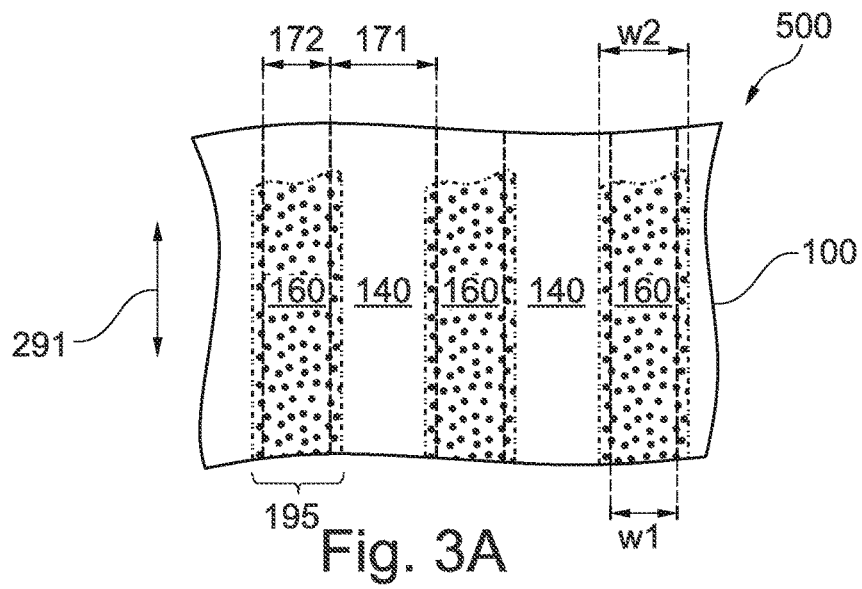
FIGS. 3A-3E illustrate schematic horizontal cross-sectional views of portions of semiconductor devices according to embodiments.
Figure 3B:
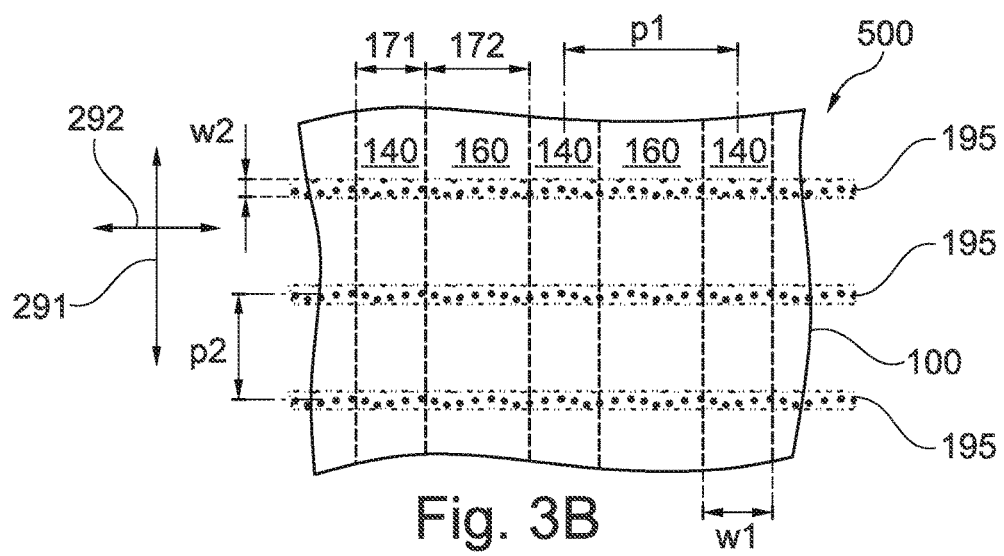

In FIG. 3B the plurality of stripe portions 195 of the lattice defect region 190 are oriented along a second horizontal direction 292 orthogonal to the first horizontal direction 291. The plurality of stripe portions 195 may confine a spreading of stacking faults along the first horizontal direction 291 within an area between two neighboring stripe portions 195. The second width w2 of the plurality of stripe portions 195 may be decoupled from the first width w1 of the emitter regions 160. For example, the second width w2 may be smaller than the first width w1. A center-to-center distance p2 of the plurality of stripe portions 195 may be in a range from 20 µm to 300 µm, for example, from 50 µm to 200 µm. The plurality of stripe portions 195 can be formed in comparatively small portions of the first sections 171 (e.g., the plurality of stripe portions 195 may be formed in portions of the first sections 171, wherein a portion of the portions is less than a threshold proportion of a section of the first sections 171). The center-to-center distance p2 of the plurality of stripe portions 195 is decoupled from a center-to-center distance p1 of the unipolar current regions 140.

Figure 3C:
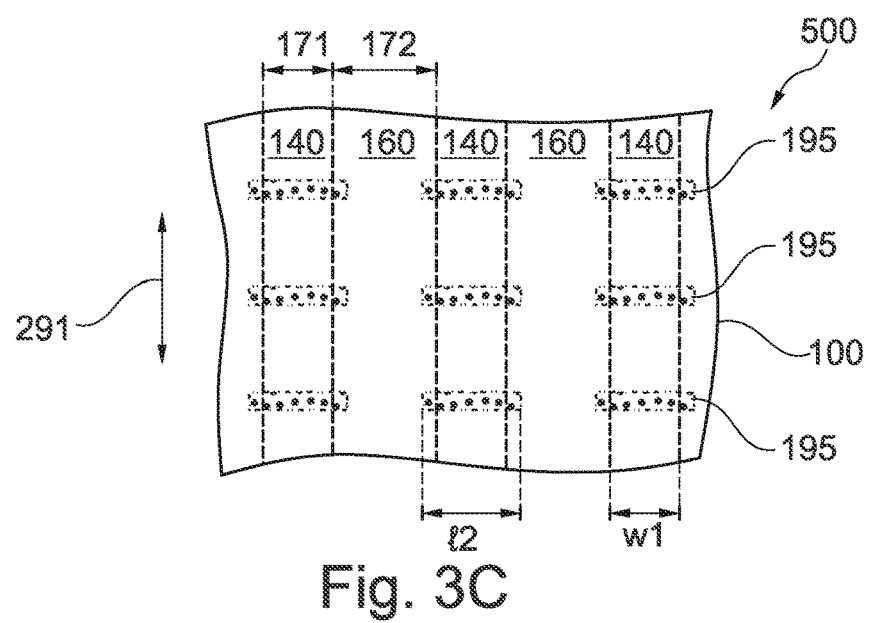

In FIG. 3C the plurality of stripe portions 195 have a longitudinal extension 12 in the range of the first width w1 of the emitter regions 160. The unipolar current region 140 are more or less completely devoid of portions of the lattice defect region 190 such that the lattice defect region 190 does not adversely affect the electric characteristics of structures formed in the unipolar current regions 140.

Figure 3D:
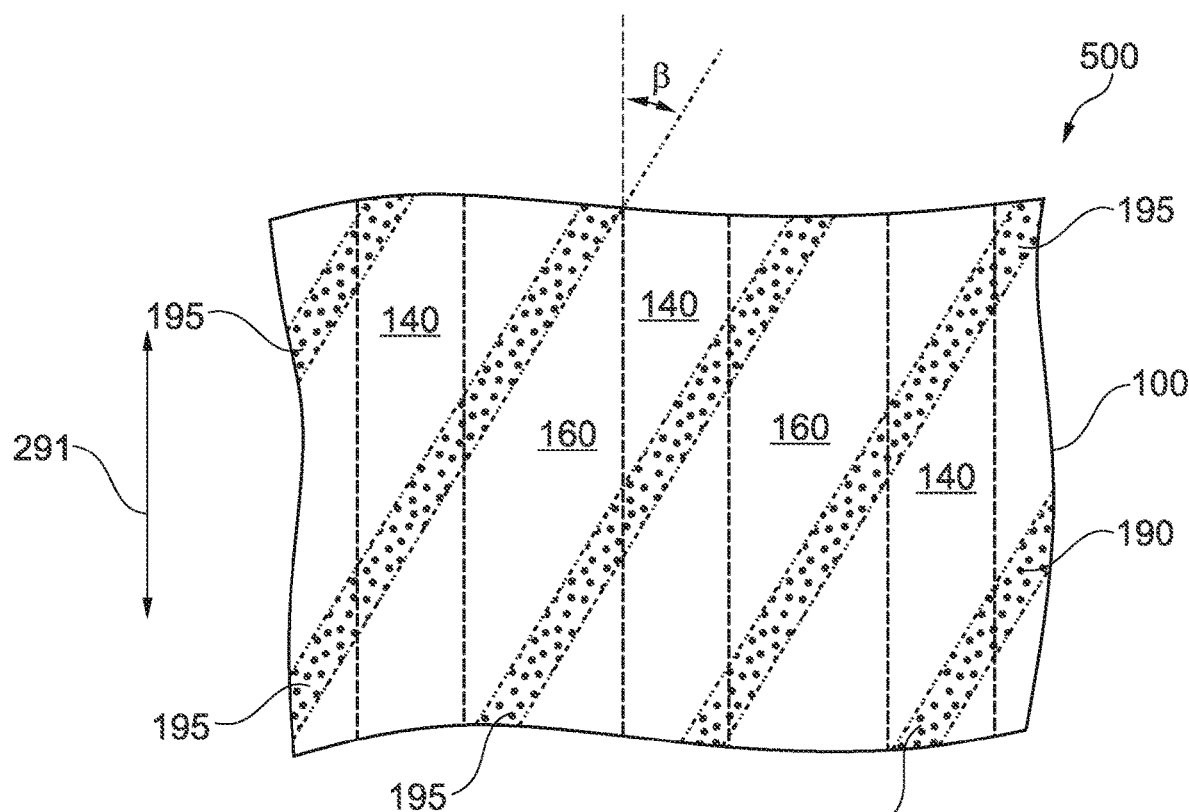

In FIG. 3D the plurality of stripe portions 195 of the lattice defect region 190 intersect the emitter regions 160 at an intersection angle β that may be in a range from 30° to 60°. For example, the plurality of stripe portions 195 may run parallel to main lattice planes in the silicon carbide body 100. The plurality of stripe portions 195 may be formed by using a simple stripe mask without alignment to the emitter regions 160 and confine a spreading of stacking faults along the first horizontal direction 291 to an area between two neighboring stripe portions 195. In other words, the orientation of the plurality of stripe portions 195 may be selected as a function of a direction along which crystal defects like stacking faults have a significant growth rate. For example, the orientation of the plurality of stripe portions may be orthogonal to a direction along which stacking faults grow at a high rate.

Figure 3E:
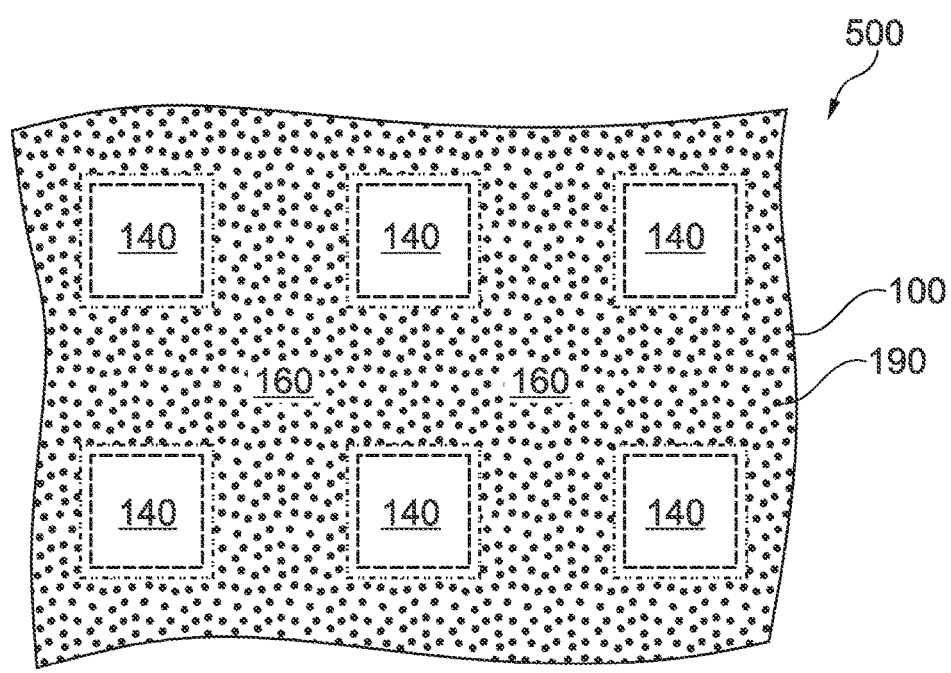

FIG. 3E shows a grid-shaped emitter region 160 laterally surrounding unipolar current regions 140. The unipolar current regions 140 may be arranged in a regular pattern that includes parallel rows and parallel columns. The lattice defect region 190 may form a grid that spares at least central portions of the unipolar current regions 140.

FIGS. 4A-8 show semiconductor devices 500 based on a silicon carbide body 100 with a first surface 101 at a front side and with a drift region 130, emitter regions 160, and unipolar current regions 140 as described with reference to FIGS. 1, 2A-2D, and 3A-3E. The semiconductor devices 500 may be SiC-MOSFETs with n-channel field effect transistor cells TC, wherein the first load terminal is a source terminal S and the second load terminal is a drain terminal D.

Figure 4A:
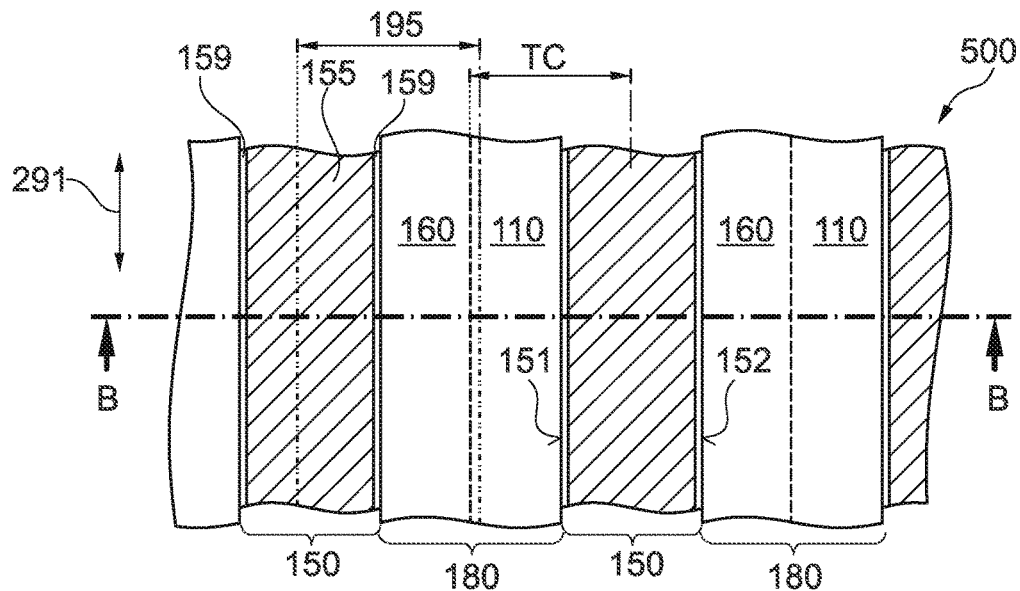
FIGS. 4A-4B illustrate a schematic horizontal and a corresponding vertical cross-sectional view of a portion of a semiconductor device according to an embodiment with trench gate structures and one-sided inversion channels.
Figure 4B:
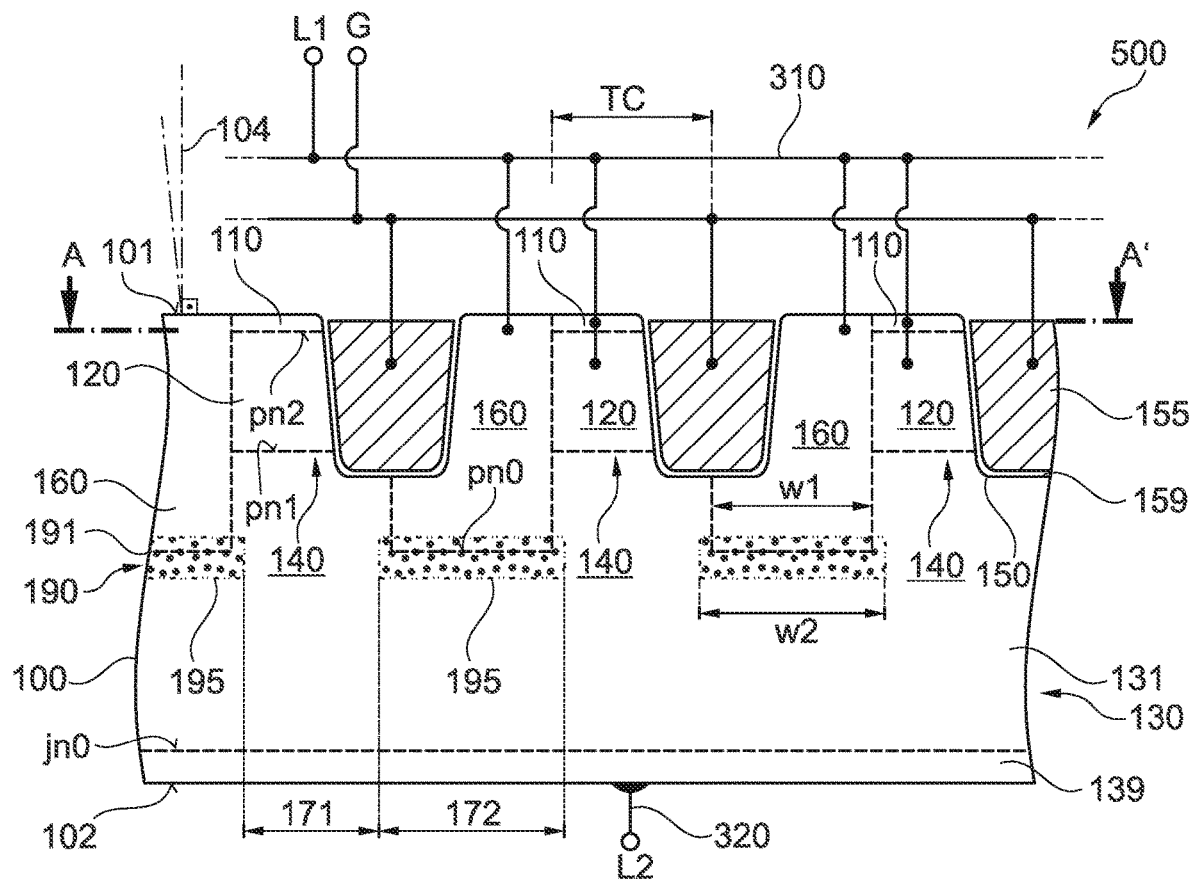

In FIGS. 4A-4B The semiconductor device 500 is a SiC-TMOSFET (SiC Trench MOSFET). The silicon carbide body 100 may be based on 4H—SiC, wherein the <0001> main crystal axis may be tilted to the surface normal 104 by an off-axis angle of about 4°, the <11-20> crystal axis may be tilted with respect to the horizontal plane by the off-axis angle and the <1-100> crystal axis may be orthogonal to the cross-sectional plane.

The transistor cells TC include trench gate structures 150 extending from the first surface 101 into the silicon carbide body 100. Sidewalls of the gate structure 150 may be vertical or may taper with increasing distance to the first surface 101. The gate structures 150 include a conductive gate electrode 155 and a gate dielectric 159 between the gate electrode 155 and the silicon carbide body 100, wherein the gate dielectric separates the gate electrode 155 and the body regions 120. The gate structure 150 may include further dielectric structures and/or conductive structures. For example, a separation dielectric may be formed between the gate electrode 155 and at least one of the source region 110, the drift region 130 and a shielding region.

Each transistor cell TC includes a body region 120 and a source region 110, wherein the body region 120 and the drift region 130 form a first pn junction pn1 and wherein the body region 120 and the source region 110 form a second pn junction pn2. The source region 110 may directly adjoin the first surface 101. The source region 110 and the body region 120 may be in direct contact with a first sidewall 151 of the gate structure 150 of the transistor cell TC.

The emitter region 160 has the conductivity type of the body region 120 and may separate a portion of the gate structure 150 from the drift region 130 and the neighboring body region 120. The emitter region 160 may be in direct contact with a second sidewall 152 of the gate structure 150 and may separate the body region 120 of a neighboring second transistor cell TC from the gate structure 150 of a first transistor cell TC. A maximum dopant concentration in the emitter region 160 may be higher, e.g., at least ten times higher than a maximum dopant concentration in the body region 120. A local dopant concentration maximum of the emitter region 160 may be between the gate structure 150 and the second surface 102, in other words, below the gate structures 150. The emitter region 160 may be effective, inter alia, as shielding region that shields the gate dielectric 159 against the electric potential of the second load electrode 320 at the rear side of the silicon carbide body 100. The unipolar current region 140 includes the body region 120 and the source region 110.

The lattice defect region 190 may include stripe portions that form upper defect regions 191, wherein the upper defect regions 191 overlap with a portion of the main pn junction pn0 between the emitter region 160 and the drift region 130, e.g., between the emitter region 160 and the drift zone 131. A horizontal second width w2 of the stripe portions 195 may be smaller than, equal to or greater than a horizontal first width w1 of the emitter regions 160.

Figure 5:
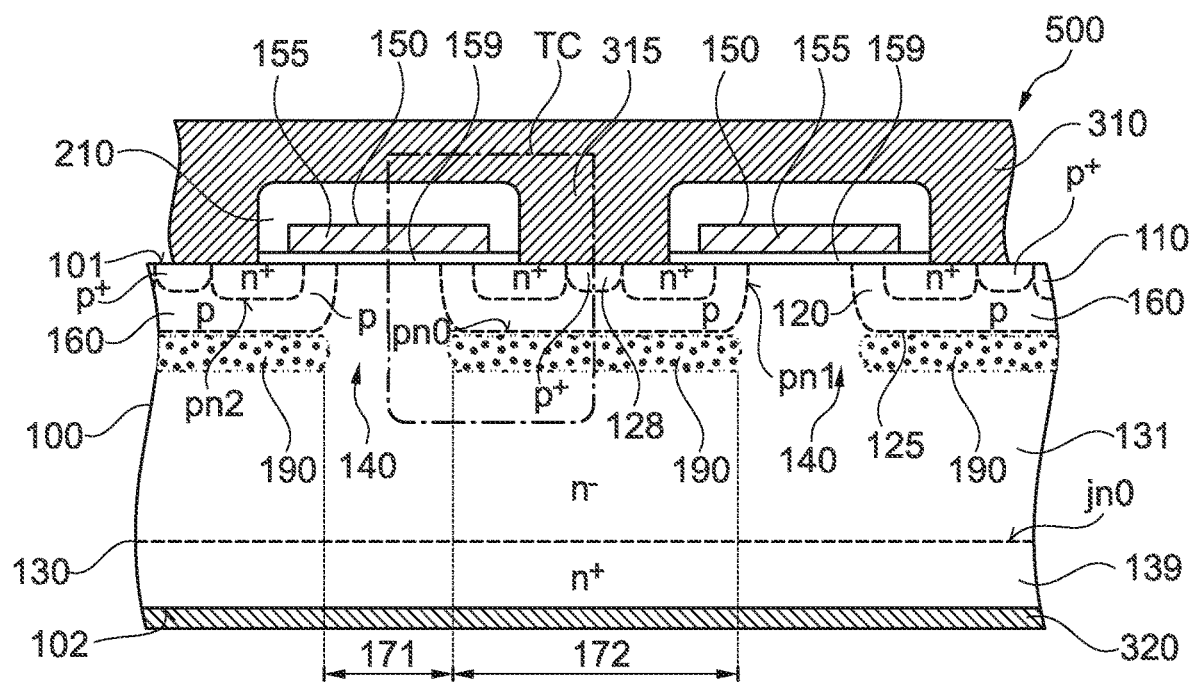
FIG. 5 shows a schematic cross-sectional view of a semiconductor device according to an embodiment related to transistor cells with planar gate structures.

FIG. 5 shows a semiconductor device 500 with n-channel transistor cells TC and planar gate structures 150 formed above the first surface 101. One common gate structure 150 may be assigned to two neighboring transistor cells TC formed symmetrically with respect to a vertical symmetry plane through the longitudinal center axis of the gate structure 150. An interlayer dielectric 210 separates the first load electrode 310 and the gate structures 150. The first load electrode 310 includes contact structures 315 extending between neighboring gate structures 150 through the interlayer dielectric 210 to or into the silicon carbide body 100.

The body regions 120 of two adjoining transistor cells TC assigned to two neighboring gate structures 150 may be portions of a continuous p-doped well 125. The p-doped well 125 and the drift region 130 form a horizontal main pn junction pn0.

A heavily doped body contact region 128 may be formed between neighboring source regions 110. In the body contact regions 128, a dopant concentration along an interface between the body contact regions 128 and the first load electrode 310 may be sufficiently high to provide an ohmic contact, e.g., a low-resistive ohmic contact between the first load electrode 310 and the body contact region 128

In a reverse biased state of the semiconductor device 500, a bipolar forward current of a body diode of the semiconductor device 500 flows through the main pn junction pn0 in an off-state of the transistor cells TC. In other words, the p-doped well 125 or at least a central section of the p-doped well 125 below the body contact regions 128 corresponds to an emitter region 160 in the sense of this application.

The unipolar on-state current of the transistor cells TC flows through the regions between two neighboring p-doped wells 125. In other words, the n-doped regions between neighboring p-doped wells 125 correspond to the unipolar current regions 140 in the sense of this application.

The lattice defect region 190 may have any of the configurations as described with reference to FIGS. 1, 2A-2B, and 3A-3E. In the illustrated embodiment, stripe portions 195 of the lattice defect region 190 are formed in the drift zone 131 and close to the p-doped wells 125. For further details, reference is made to the description of the preceding FIGS.

Figure 6:
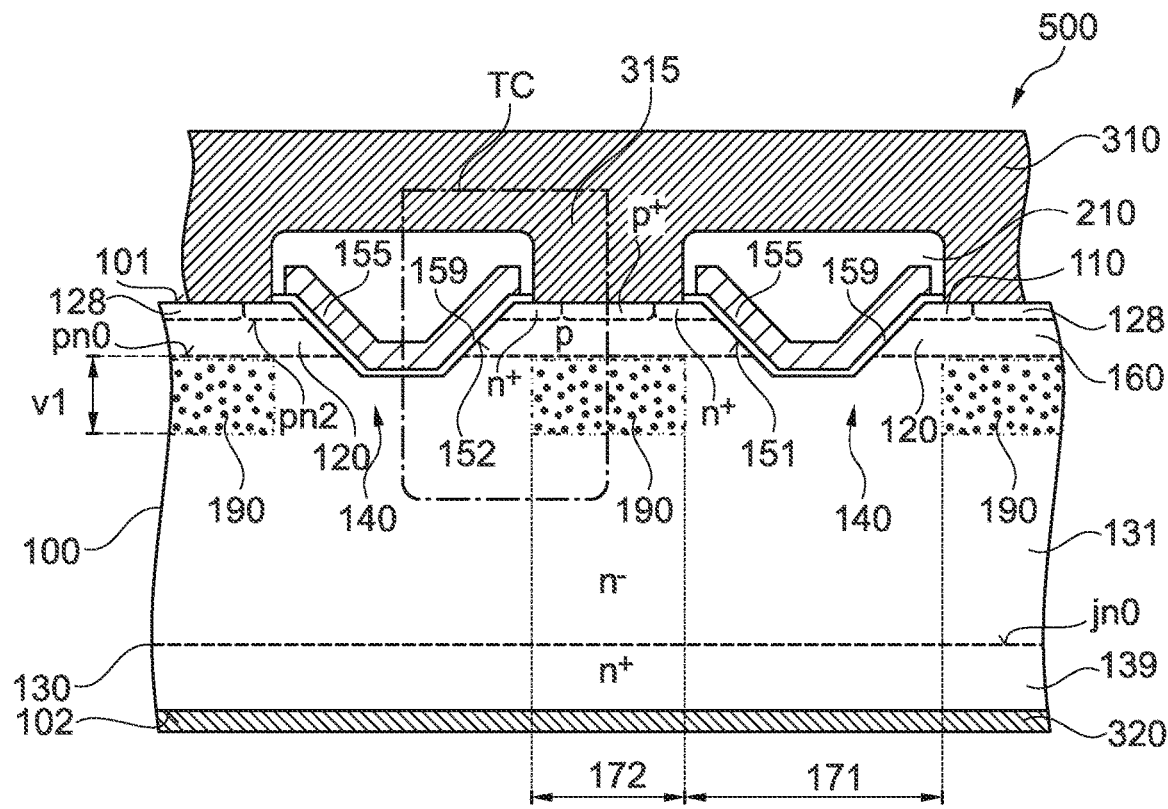
FIG. 6 shows a schematic cross-sectional view of a semiconductor device according to an embodiment related to transistor cells with trench gate structures and two-sided channel.

In FIG. 6 the gate structures 150 are formed in trenches with approximately V-shaped vertical cross-sectional area. Sidewalls of semiconductor mesas between neighboring gate structures 150 may be, for example, (0-33-8) lattice planes. The body regions 120 may laterally extend from a first one of two neighboring gate structures 150 to the other one. Inversion channels may be formed along opposite first and second sidewalls 151, 152 of the gate structures 150. Heavily doped body contact regions 128 may be formed between neighboring source regions 110.

In a reverse biased state of the semiconductor device 500, the bipolar forward current of the body diode mainly flows through central portions of the semiconductor mesas below the body contact regions 128. In other words, the central portions of the body regions 120 below the body contact regions 128 correspond to emitter regions 160 in the sense of this application.

The unipolar on-state current of the transistor cells TC mainly flows along the first and second sidewalls 151, 152 of the gate structures 150. In other words, the regions between neighboring body contact regions 128 and close to the first and second sidewalls 151, 152 correspond to the unipolar current regions 140 in the sense of this application.

The silicon carbide body 100 may include a lattice defect region 190 that may have any of the configurations as described with reference to FIGS. 1, 2A-2B, and 3A-3E. In the illustrated embodiment, the lattice defect region 190 includes stripe portions 195, wherein each stripe portion 195 may be formed in a central section of a semiconductor mesa between two neighboring gate structures 150 and at a distance to both neighboring gate structures 150. For further details, reference is made to the description of the preceding FIGS.

Figure 7:
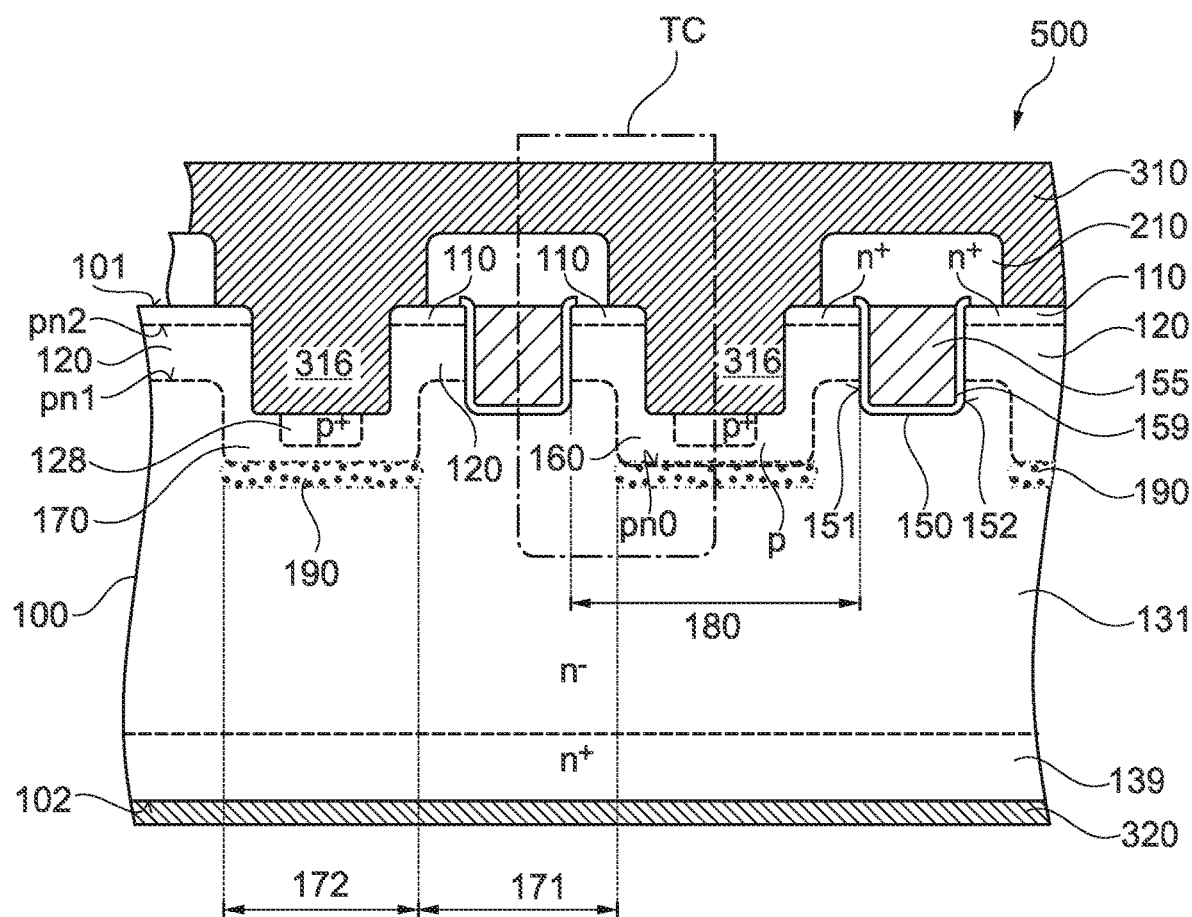
FIG. 7 shows a schematic cross-sectional view of a semiconductor device according to an embodiment related to trench gate structures and two-sided channel.

In FIG. 7 the gate structures 150 may have a horizontal width and a horizontal length within the same order of magnitude. For example, the horizontal length and the horizontal width may be approximately the same. Between neighboring gate structures 150, at least one deep contact structure 316 may extend from the first load electrode 310 into the silicon carbide body 100. The deep contact structure 316 may form a grid with one gate structure 150 formed per mesh of the grid. Alternatively, the deep contact structure 316 may include a plurality of ring-shaped structures, wherein each ring-shaped structure surrounds one gate structure 150. Inversion channels may be formed on one, two, three of four sides of each gate structure 150.

Shielding regions 170 may be formed between the deep contact structure(s) 316 and the drift region 130. The shielding regions 170 may form the main pn junction pn0 and may shield the gate dielectric 159 against the electric potential of the second load electrode 320 at the rear side of the silicon carbide body 100. Heavily doped contact region(s) 128 may be formed at the bottom of the deep contact structure(s) 316.

In a reverse biased state of the semiconductor device 500, a bipolar forward current of a body diode mainly flows through the shielding regions 170. The shielding regions 170 correspond to emitter regions 160 in the sense of this application.

The unipolar on-state current of the transistor cells TC mainly flows along one, two, three or all four sidewalls of the gate structures 150. In other words, the regions between neighboring shielding regions 170 correspond to unipolar current regions 140 in the sense of this application.

The silicon carbide body 100 may include a lattice defect region 190 that may have any of the configurations as described with reference to FIGS. 1, 2A-2B, and 3A-3E. In the illustrated embodiment, a grid-shaped lattice defect region 190 in the drift zone 131 is formed below the grid-shaped deep contact structure 316. For further details, reference is made to the description of the preceding FIGS.

Figure 8:
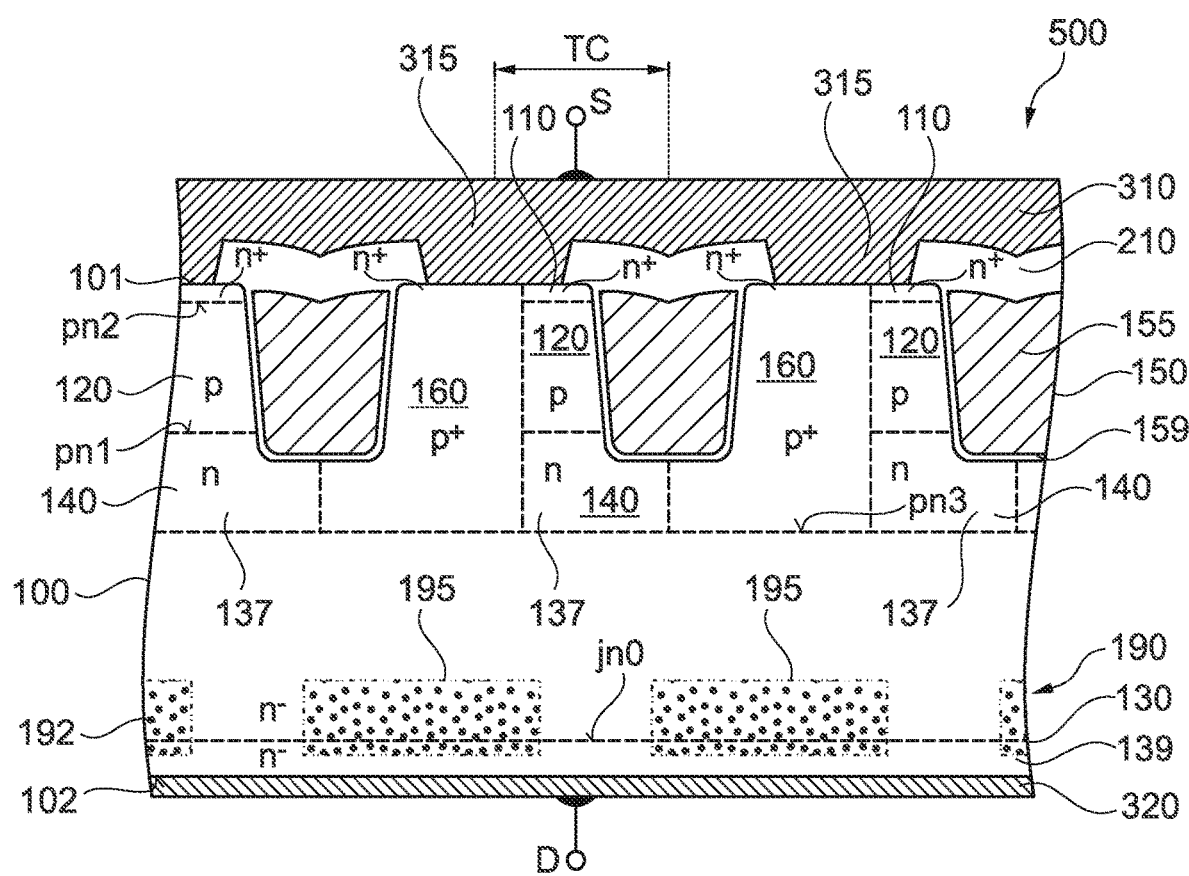
FIG. 8 shows a schematic vertical cross-sectional view of a portion of a semiconductor device according to an embodiment related to transistor cells at a front side and to a lattice defect region close to a rear side.

The semiconductor device 500 of FIG. 8 may include a silicon carbide body 100 and trench gate structures 150 as described with reference to FIGS. 4A-4B. An interlayer dielectric 210 covers the gate electrodes 155. A first load electrode 310 at the front side includes contact structures 315 extending through openings in the interlayer dielectric 210 to or into the silicon carbide body 100. The drift region 130 includes a drift zone 131 and current spread regions 137 between neighboring shielding regions 170.

The lattice defect region 190 includes stripe portions 195 that form a lower defect region 192 overlapping the rear side junction jn0. The stripe portions 195 may have any of the configurations as described with reference to FIGS. 3A-3D. In the illustrated embodiment the stripe portions 195 are aligned to the emitter regions 160 and run parallel to the emitter regions 160.

Figure 9A:
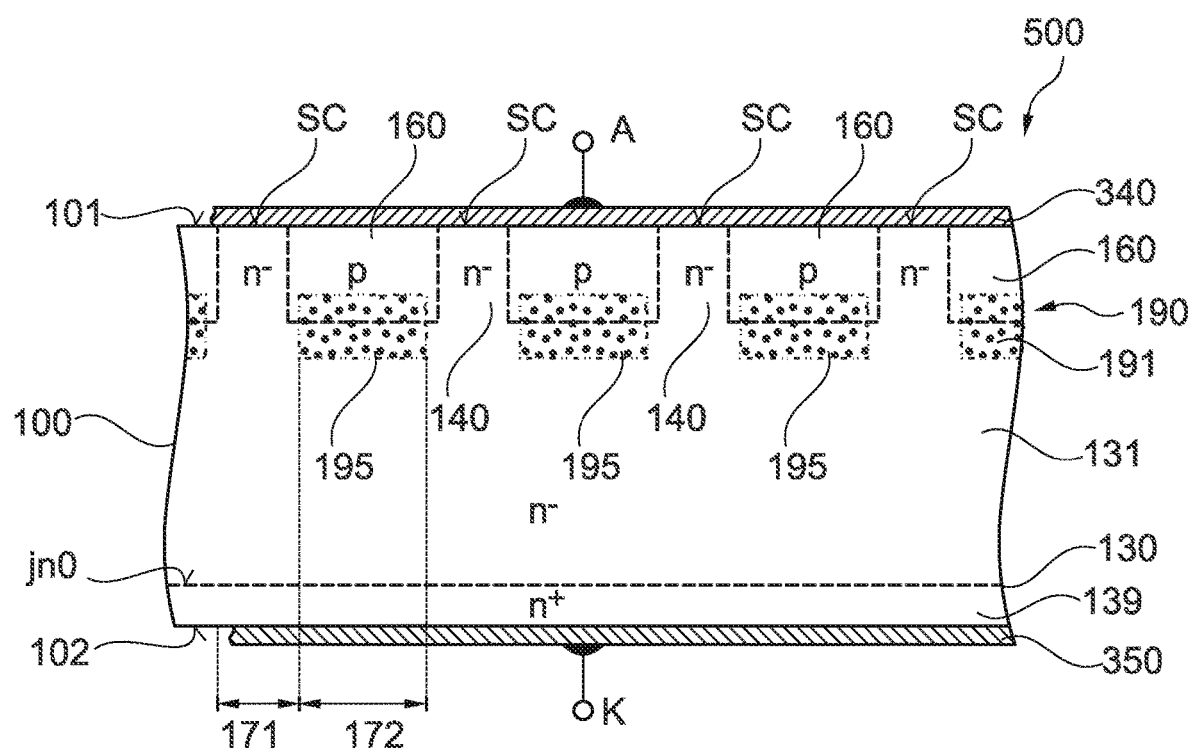
FIGS. 9A-9B are schematic vertical cross-sectional views of semiconductor devices according to embodiments related to merged pin Schottky diodes.
Figure 9B:
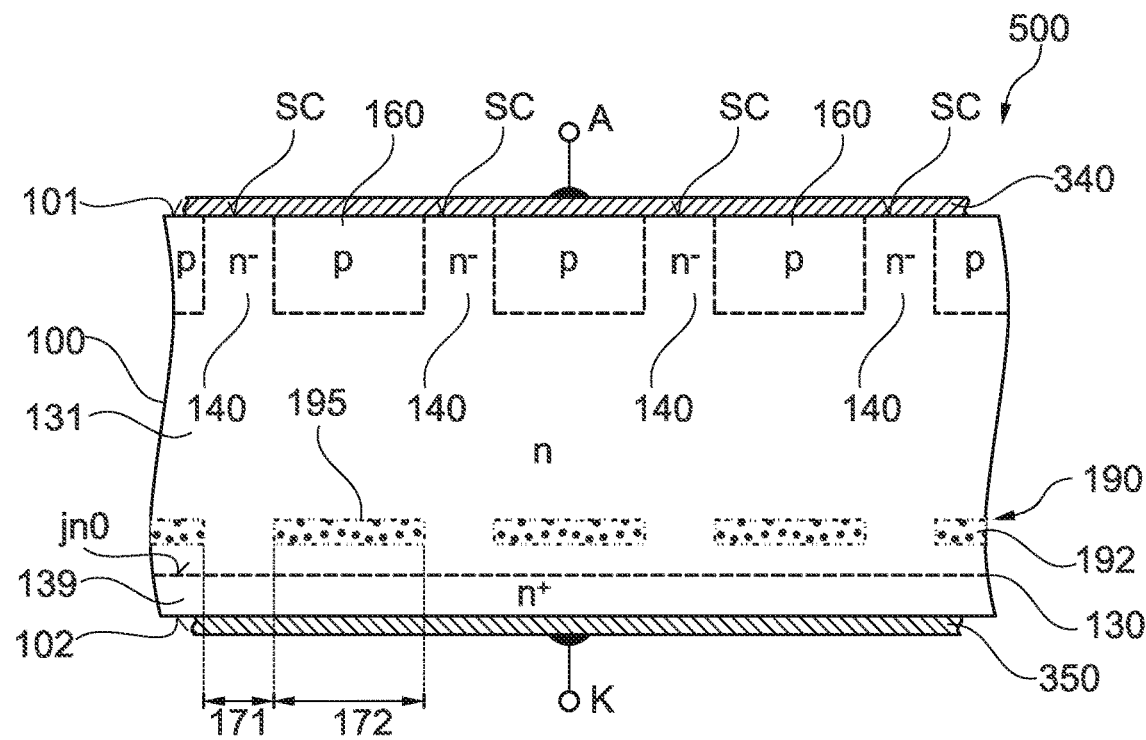

FIGS. 9A-9B show semiconductor devices 500 including an MPS structure formed in a silicon carbide body 100 with an doped drift region 130 including an n doped drift zone 131 and an n doped base portion 139 as described above.

P-doped emitter regions 160 extend from the first surface 101 into the silicon carbide body 100. The emitter regions 160 and the drift region 130 form main pn junctions pn0. Between neighboring emitter regions 160, cathode regions of the conductivity type of the drift zone 131 connect the first surface 101 with the drift region 130.

An anode electrode 340 is formed directly on the first surface 101. The anode electrode 340 may be electrically connected or coupled to an anode terminal A or may form the anode terminal A. The anode electrode 340 and the emitter regions 160 form ohmic, for example, low-resistive ohmic contacts. The anode electrode 340 and the cathode regions form Schottky contacts SC.

The cathode regions form unipolar current regions 140 in the sense of this application. At a rear side, a cathode electrode 350 directly adjoins the second surface 102 and forms an ohmic contact, e.g., a low-resistive ohmic contact with the base portion 139. The cathode electrode 350 may form or may be electrically connected to a cathode terminal K.

A forward current of the semiconductor device 500 sets in at the comparatively low set-in voltage of the Schottky contacts SC. At higher load current, the bipolar current through the main pn junction pn0 reduces the forward voltage compared to the voltage drop across a Schottky diode at the same load current. Depletion regions laterally spreading from the emitter regions 160 may shield the Schottky contacts SC in a blocking state and may pinch off a leakage path through the Schottky contacts SC. The silicon carbide body 100 includes any of the lattice defect regions 190 as described with reference to FIGS. 1, 2A-2B and 3A-3E.

In FIG. 9A the lattice defect region 190 includes an upper defect region 191 with stripe portions 195 overlapping the emitter regions 160.

In FIG. 9B the lattice defect region 190 includes a lower defect region 192 with stripe portions 195 close to the rear side junction jn0.

Figure 10:
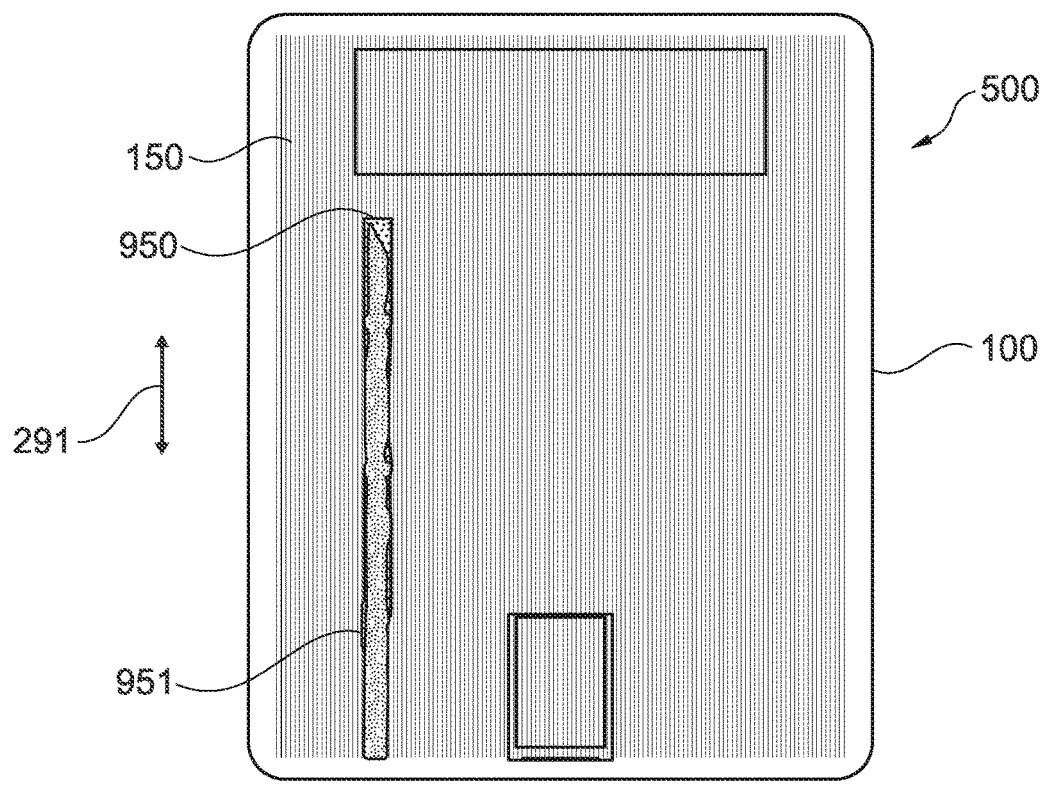
FIG. 10 is a schematic plan view of a semiconductor device according to a comparative example for discussing effects of the embodiments.

FIG. 10 shows a reference example of a semiconductor device 500 with trench gate structures 150 extending along a first horizontal direction 291. The silicon carbide body 100 may have the 4H polytype and a crystal orientation as described with reference to FIGS. 4A-4B. During the lifetime of the semiconductor device 500, bipolar degradation may let grow an SF (stacking fault) 950 along a main lattice plane, for example, along the <1100> crystal direction. The SF spreads mainly along the first horizontal direction 291 across a comparatively large SF spreading area 951

Figure 11:
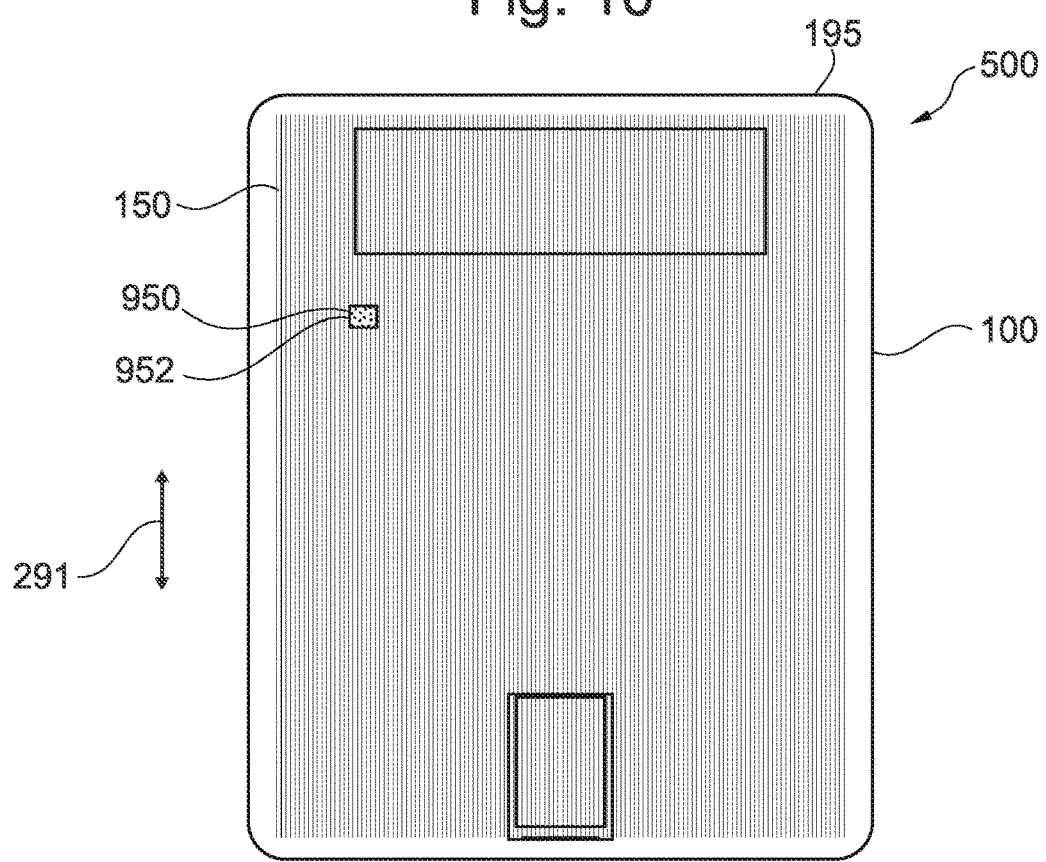
FIG. 11 is a schematic plan view of a semiconductor device according to an embodiment for discussing effects of the embodiments.

In FIG. 11 the semiconductor device 500 includes stripe portions 195 of a lattice defect region 190 according to the embodiments. The spread of the stacking fault can be confined to the comparatively narrow SF spreading area 952 between two neighboring stripe portions 195.

FIGS. 12A-15 show methods of manufacturing a semiconductor device from a silicon carbide substrate 700 on the basis of cross-sectional views. The methods may be used to form any of the semiconductor devices 500 as described with reference to FIGS. 1, 2A-2B, 3A-3E, 4A-4B, 5-9 and 11. Any of the semiconductor devices 500 as described with reference to FIGS. 1, 2A-2B, 3A-3E, 4A-4B, 5-9 and 11 may be obtained with any of the methods of FIGS. 12A-15.

Figure 12A:
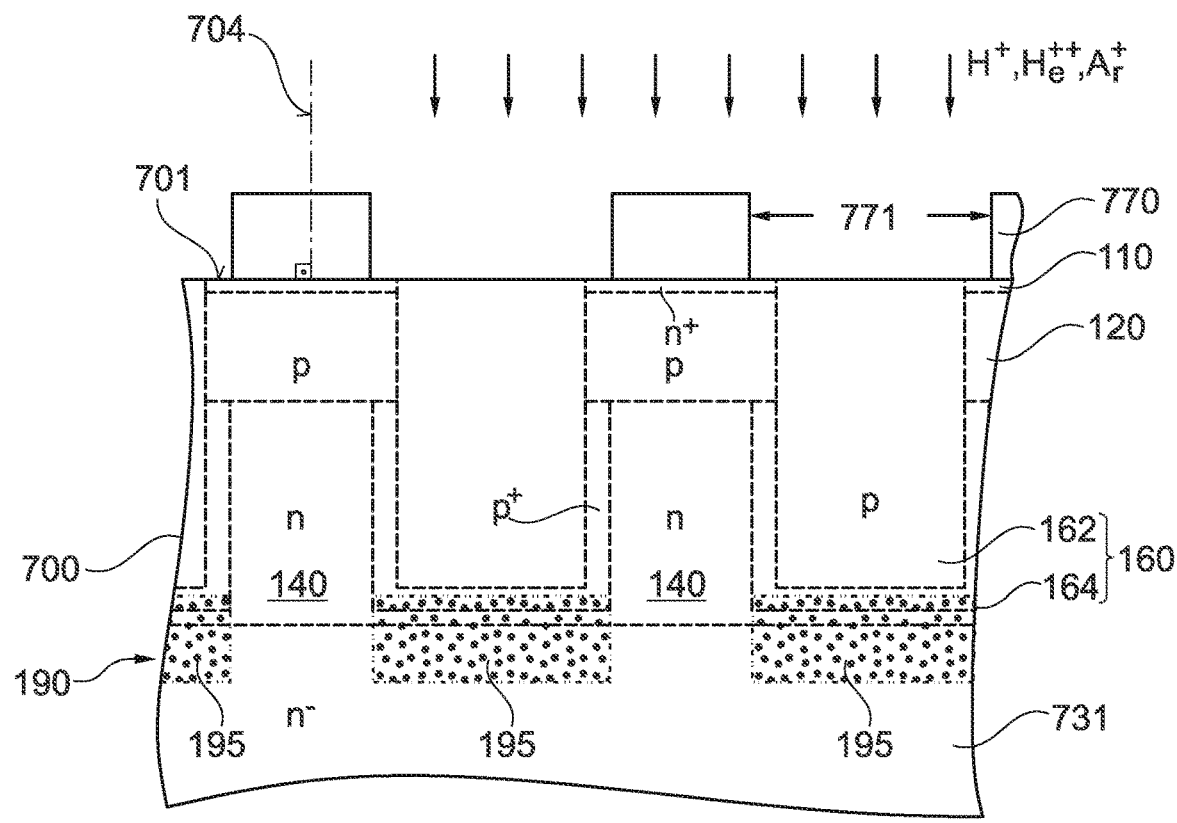
FIGS. 12A-12B show schematic cross-sectional views of a semiconductor substrate for illustrating a method of manufacturing a semiconductor device according to an embodiment, wherein lattice defect regions are formed prior to forming trenches for gate electrodes.

FIG. 12A shows a silicon carbide substrate 700 that may consist of or include a silicon carbide disc or silicon carbide wafer cut from a single crystal silicon carbide ingot. According to an embodiment, the silicon carbide substrate 700 may include or consist of a layer grown by epitaxy on a suitable single-crystalline base. The silicon carbide substrate 700 may be 15R—SiC, 2H—SiC, 4H—SiC or 6H—SiC, by way of example. In addition to the main constituents silicon and carbon, the silicon carbide substrate 700 may include dopant atoms, for example, nitrogen N, phosphorus P, beryllium Be, boron B, aluminum Al, and/or gallium Ga. In addition, the silicon carbide substrate 700 may include unwanted impurities, for example H, oxygen and/or carbon.

The silicon carbide substrate 700 may be a thin, circular disc or wafer with a main surface 701 at a front side and a rear side surface at a rear side of the disc or wafer. The rear side surface and the main surface 701 are parallel to each other, wherein the main surface 701 may be planar or ripped. For simplicity, in case of a ripped main surface 701, a mean plane through the ripped main surface 701 is regarded as main surface 701 in the following. A diameter of the silicon carbide substrate 700 may correspond to a production standard for semiconductor wafers. A surface normal 704 of the main surface 701 defines a vertical direction. Directions orthogonal to the surface normal 704 are lateral and horizontal directions.

The silicon carbide substrate 700 may include a heavily doped base substrate and/or an epitaxial layer grown by epitaxy on a base substrate, wherein the epitaxial layer may include differently doped sub-layers and laterally spaced doped regions. The doped regions may include an n doped drift layer 731, p doped body regions 120 between the main surface 701 and the drift layer 731, n doped current spread regions 137 between the body regions 120 and the drift layer 731, n doped source regions 110 between the main surface 701 and the body regions 120, and implant regions extending between neighboring body regions 120 from the main surface 701 to or into the drift layer 731.

One or more of the doped regions, e.g., the source regions 110 may be formed at a later stage.

Each implant region may include a first implant portion and a second implant portion formed by implants of dopants at different dose and energy. For example, the second implant portion may result from a high dose/high energy implant. A heat treatment may activate the dopants in the implant regions. The implant regions with the activated dopants form emitter regions 160 with first shielding portions 161 and more heavily doped second shielding portions 162.

A first implant mask 770 with first mask openings 771 is formed on the main surface 701. The first mask openings 771 expose at least portions of the emitter regions 160. H, He and/or Ar are implanted through the first mask openings 771. The first implant mask 770 and an implant mask for forming the source regions 110 may be complementary masks.

FIG. 12A shows first mask openings 771 aligned to the emitter regions 160. The implanted H, He and/or Ar form stripe portions 195 of a lattice defect region 190, wherein the stripe portions 195 overlap with the pn junction between the emitter region 160 and the drift layer 731. The first implant mask 770 may be removed and a trench etch mask 772 may be formed on the main surface 701. An etch process that may include, for example, reactive ion beam etching may form gate trenches 750.

Figure 12B:
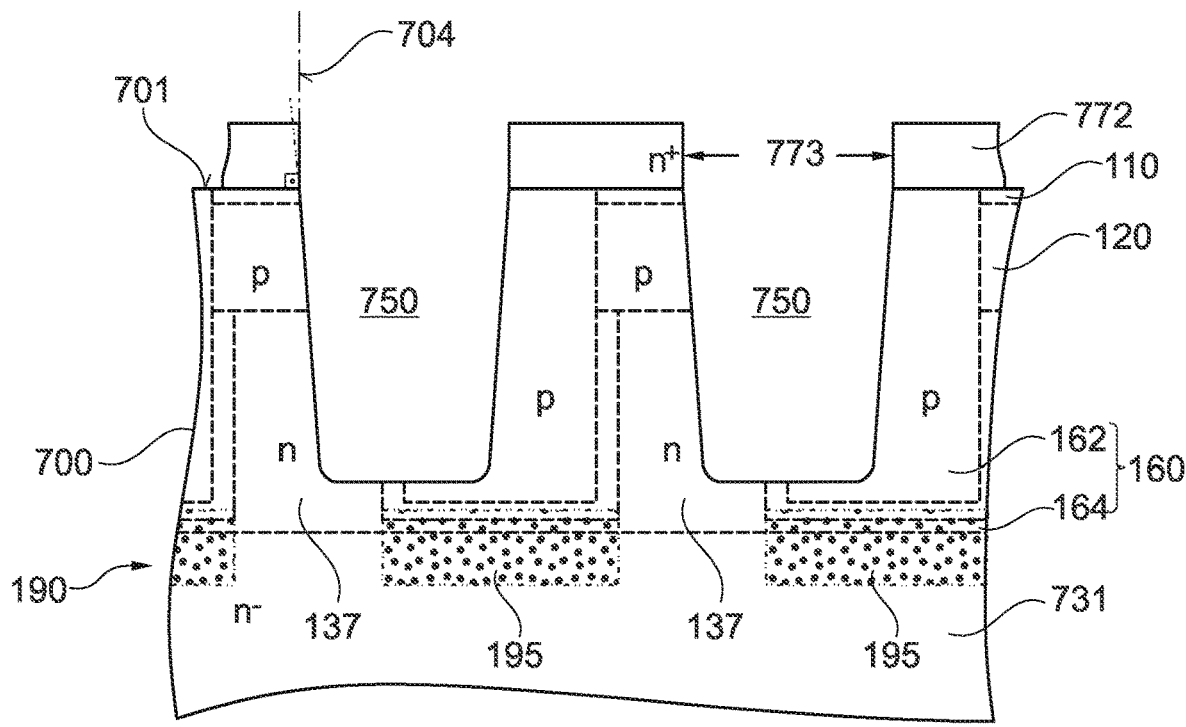

FIG. 12B shows the gate trenches 750 formed in the vertical projection of trench mask openings 773 in the trench etch mask 772. The gate trenches 750 may extend through the body regions 120 and into the current spread regions 137. A vertical extension of the gate trenches 750 is smaller than a vertical extension of the emitter regions 160.

The first implant mask 770 is formed at a stage, where the main surface 701 is planar and devoid of steps and trenches such that formation of the lattice defect region 190 involves comparatively well-controllable processes.

Figure 13A:
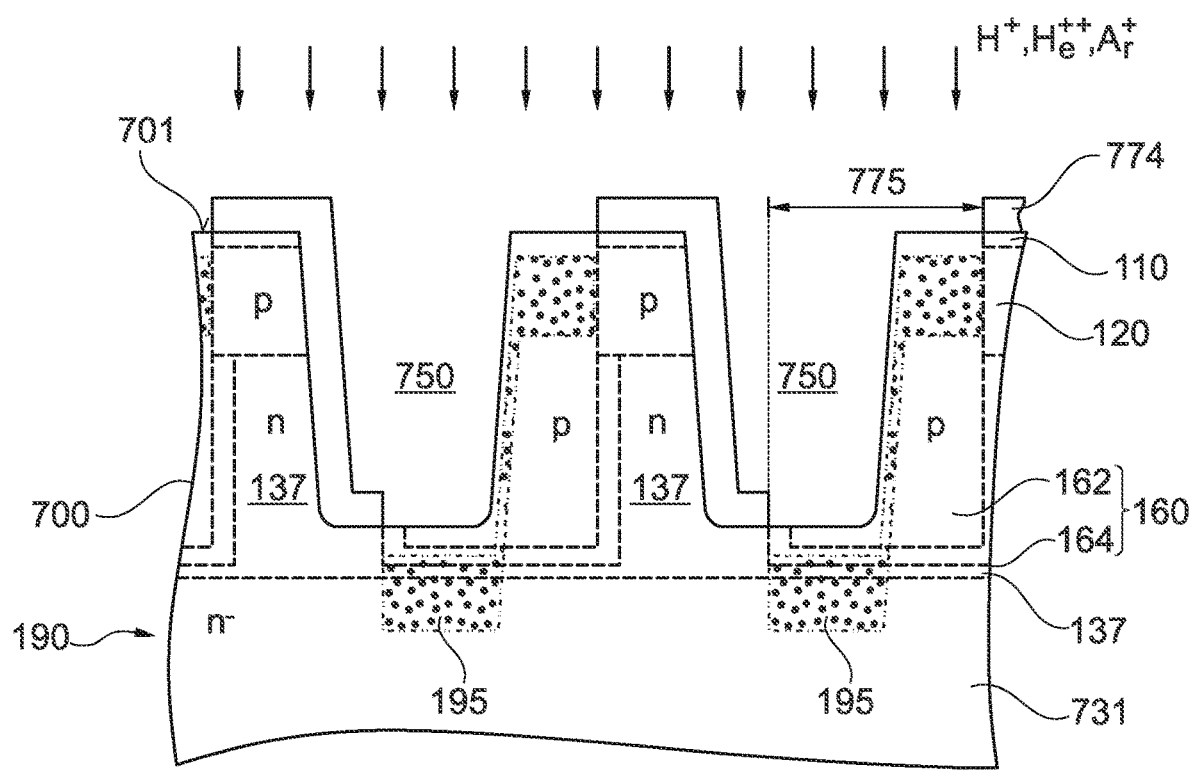
FIGS. 13A-13B show schematic cross-sectional views of a semiconductor substrate for illustrating a method of manufacturing a semiconductor device according to an embodiment, wherein lattice defect regions are formed prior to forming gate electrodes in trenches.
Figure 13B:
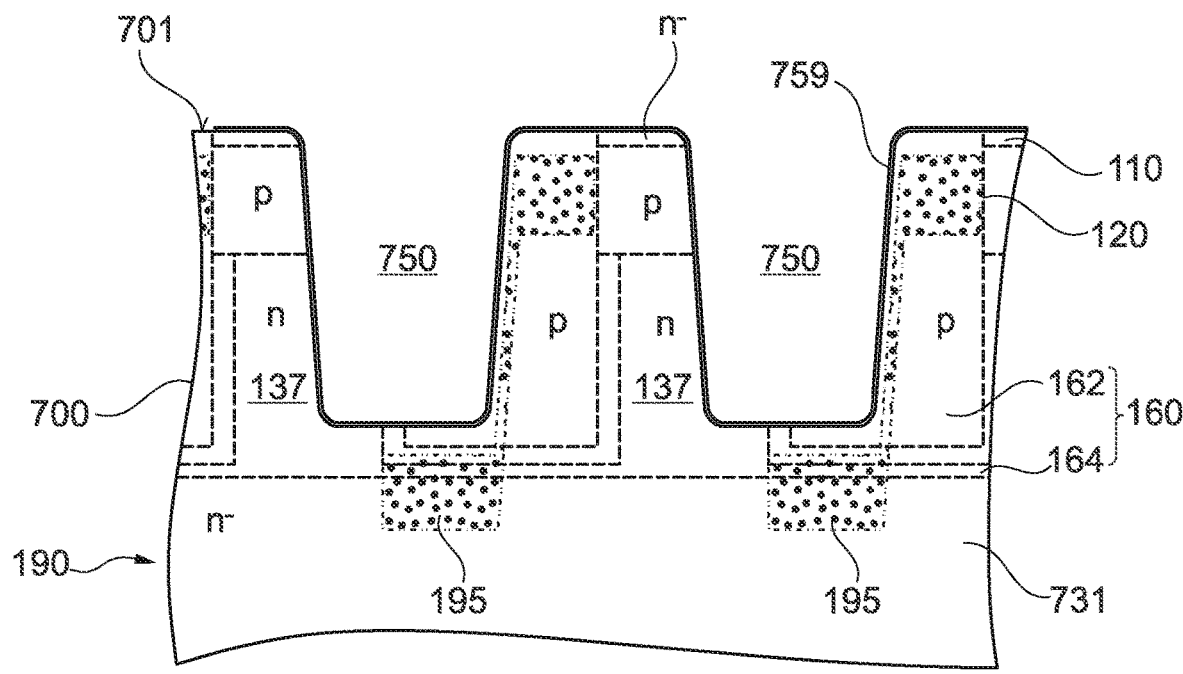

According to FIGS. 13A-13B the gate trenches 750 are formed prior to H, He and/or Ar implant. A second implant mask 774 is formed.

As illustrated in FIG. 13A, the second implant mask 774 covers first trench sidewalls that expose the body regions 120 and may cover adjoining portions of the trench bottom and/or the main surface 701. Second implant mask openings 775 in the second implant mask 774 expose portions of the trench bottom along the second trench sidewalls exposing the emitter regions 160 and may expose the second trench sidewalls and adjoining portions of the main surface 701. A distance between the stripe portions 195 and the current spread regions 137, through which the unipolar transistor current flows, can be precisely defined. The second implant mask 774 may be removed. A deposition process or a heat treatment in an atmosphere containing oxygen may form a gate dielectric layer 759.

FIG. 13B shows the gate dielectric layer 759, which remains unaffected by a H, He and/or Ar implant.

Figure 14A:
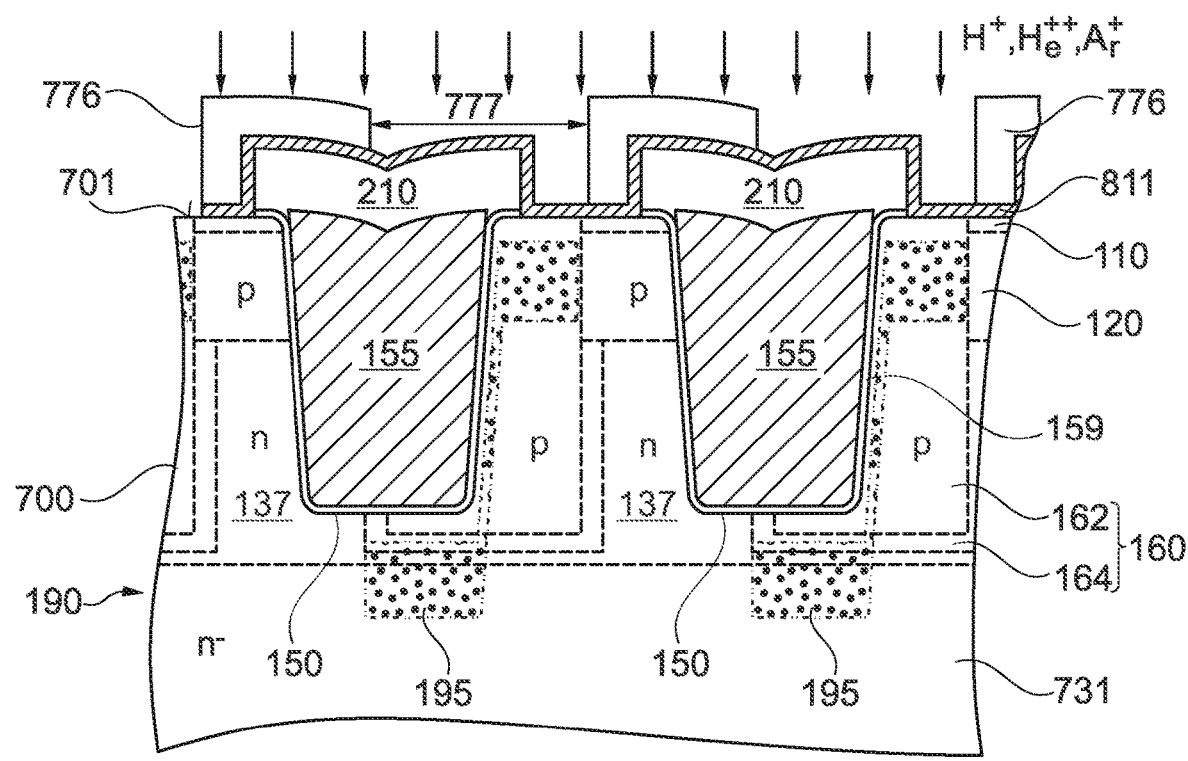
FIGS. 14A-14B show schematic cross-sectional views of a semiconductor substrate for illustrating a method of manufacturing a semiconductor device according to an embodiment, wherein lattice defect regions are formed prior to forming a thick front side metallization layer.
Figure 14B:
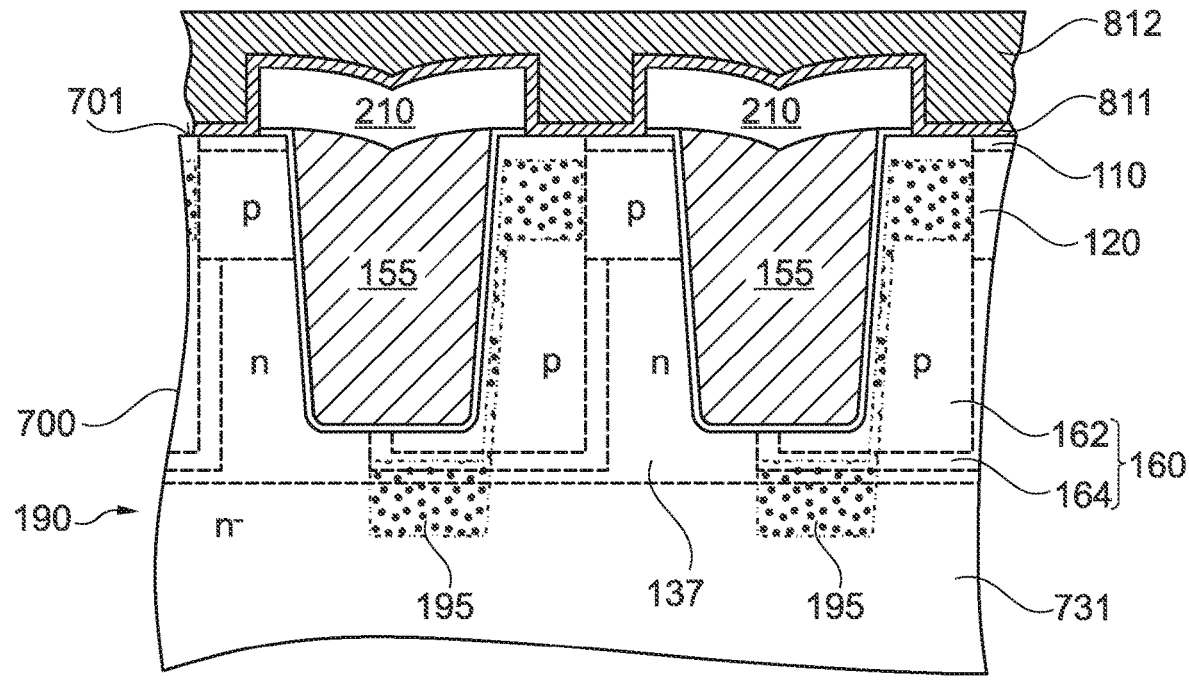

FIGS. 14A-14B show a gate electrode 155 formed in the gate trenches 750 after forming the gate dielectric layer 759 as described with reference to FIG. 13B. An interlayer dielectric layer may be deposited. Openings are etched into the interlayer dielectric layer between neighboring gate trenches. A thin metal layer is deposited that covers exposed portions of the main surface 701 and residuals of the interlayer dielectric layer. A third implant mask 776 may be formed, wherein third mask openings 777 in the third implant mask 776 are in the vertical projection of at least a portion of the emitter region 160 directly below the gate trenches. H, He and/or Ar are implanted through the third mask openings 777.

FIG. 14A shows gate structures 150 including the gate electrode 155 and residuals of the gate dielectric layer of FIG. 12B. The implanted H, He and/or Ar form a lattice defect region 190 with stripe portions 195 in a vertical projection of the third mask openings 777. Residuals of the interlayer dielectric layer form an interlayer dielectric 210. The third implant mask 776 may be removed.

FIG. 14B shows a thick metallization layer 812 deposited on the first metallization layer 811 after removal of the third implant mask 776.

Figure 15:
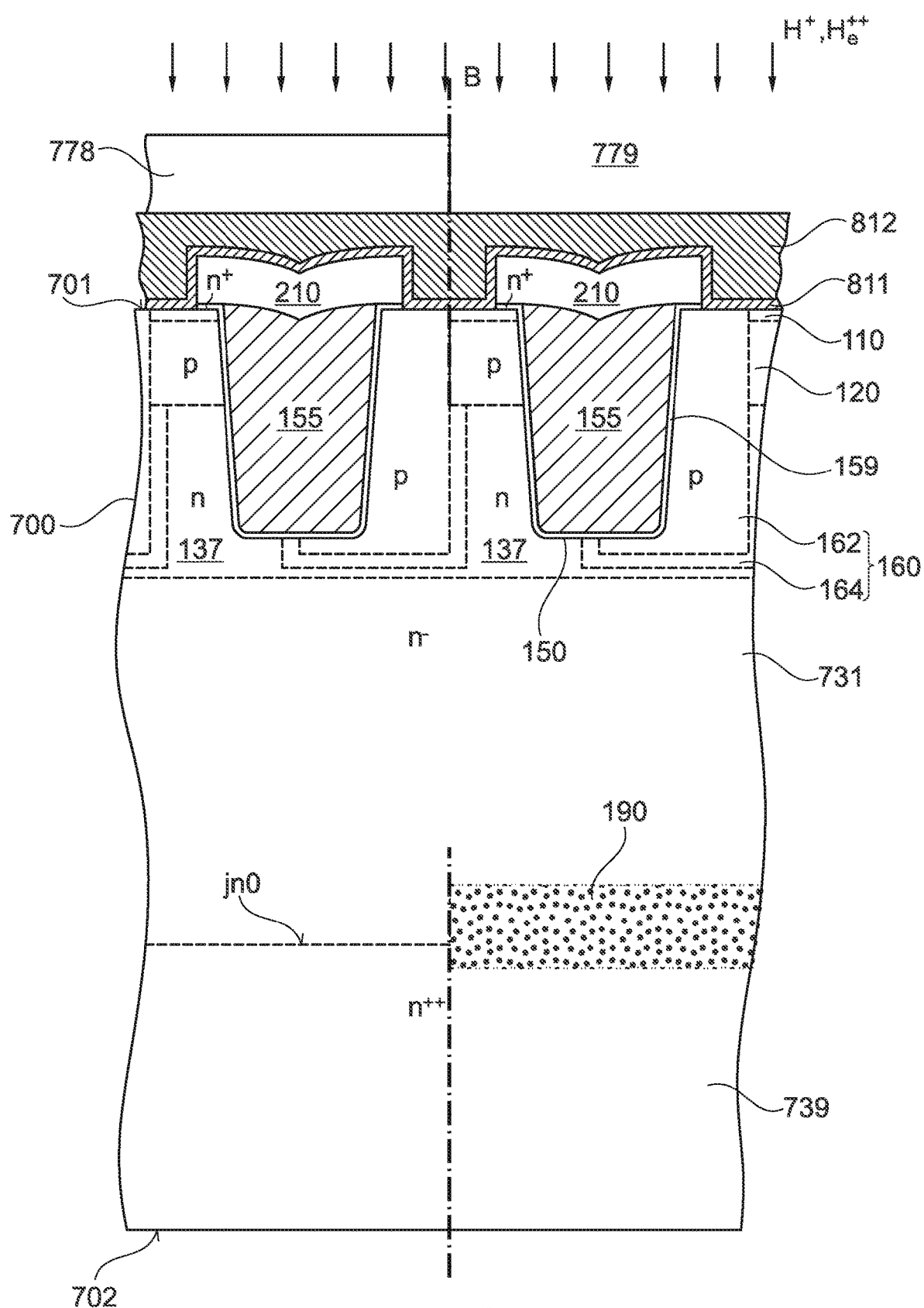
FIG. 15 illustrates a schematic cross-sectional view of a semiconductor substrate for illustrating a method of manufacturing a semiconductor device according to an embodiment, wherein lattice defect regions are formed after forming a thick front side metallization layer.

FIG. 15 shows a fourth implant mask 778 formed on the thick metallization layer 812. H, He and/or Ar are implanted through fourth mask openings 779 in the fourth implant mask 778 for form a lattice defect region 190. The left half and the right half of FIG. 15 are cross-sections in two different, parallel vertical cross-sectional planes. In other words, along a direction orthogonal to the cross-sectional plane stripe portions 195 of the lattice defect region 190 alternate with regions without or with a lower density of lattice defects. Providing the fourth implant mask 778 for the implant at a comparatively late stage of processing may ease the integration of the formation of lattice defect regions 190 in existing process flows.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor device comprising a silicon carbide body that comprises:
    a first section and a second section, wherein the first section is adjacent to the second section;
    a drift region formed in the first section and the second section; and
    a lattice defect region in a portion of the drift region in the second section, wherein a first density of lattice defects comprising interstitials and vacancies in the lattice defect region is at least double a second density of lattice defects comprising interstitials and vacancies in a portion of the drift region outside the lattice defect region.

2. The semiconductor device according to claim 1, wherein
    the lattice defect region is absent in at least a portion of the first section.

3. The semiconductor device according to claim 1, comprising:
    an emitter region in the second section, wherein the emitter region is between a first surface of the silicon carbide body and the drift region and wherein the emitter region and the drift region form a main pn junction; and
    a unipolar current region in the first section, wherein the unipolar current region is between the first surface and the drift region and wherein the unipolar current region comprises at least one of a body region of a transistor cell or a cathode region of a Schottky contact.

4. The semiconductor device according to claim 3, wherein
    the lattice defect region comprises an upper defect region in a part of the drift region within a threshold distance of the main pn junction.

5. The semiconductor device according to claim 4, wherein
    the upper defect region overlaps the main pn junction.

6. The semiconductor device according to claim 1, wherein
    the silicon carbide body comprises a base portion between a second surface of the silicon carbide body and the drift region, wherein the base portion and the drift region form a rear side junction and wherein the lattice defect region comprises a lower defect region in a part of the drift region within a threshold distance of the rear side junction.

7. The semiconductor device according to claim 6, wherein
    the lower defect region overlaps the rear side junction.

8. The semiconductor device according to claim 1, wherein
    the lattice defect region comprises a plurality of parallel stripe portions.

9. The semiconductor device according to claim 8, comprising:
    a plurality of stripe-shaped unipolar current regions,
    wherein the plurality of parallel stripe portions run parallel to the plurality of stripe-shaped unipolar current regions.

10. The semiconductor device according to claim 8, comprising
    a plurality of stripe-shaped unipolar current regions,
    wherein the plurality of parallel stripe portions run transverse to the plurality of stripe-shaped unipolar current regions.

11. The semiconductor device according to claim 1, wherein
    a plurality of unipolar current regions are arranged in rows and columns and wherein the lattice defect region forms a grid with the plurality of unipolar current regions formed in meshes of the grid.

12. The semiconductor device according to claim 1, wherein
    the first section comprises a body region of a transistor cell.

13. The semiconductor device according to claim 1, wherein
    the first section comprises a Schottky contact.

14. A method of manufacturing a semiconductor device, the method comprising:
    providing a silicon carbide substrate comprising a first section and a second section, wherein the first section is adjacent to the second section, wherein the silicon carbide substrate comprises a drift layer in the first section and the second section; and
    forming a lattice defect region in a portion of the drift layer in the second section, wherein a first density of lattice defects comprising interstitials and vacancies in the lattice defect region is at least double a second density of lattice defects comprising interstitials and vacancies in a portion of the drift layer outside the lattice defect region.

15. The method according to claim 14, wherein
    the lattice defect region is not formed in at least a portion of the first section.

16. The method according to claim 14, wherein
    forming the lattice defect region comprises implanting at least one of hydrogen (H), helium (He) or argon (Ar) into the second section through a patterned implant mask.

17. The method according to claim 14, comprising:
    performing a heat treatment for activating implanted dopants;
    implanting at least one of hydrogen (H), helium (He) or argon (Ar) after performing the heat treatment; and forming a gate trench extending from a main surface of the silicon carbide substrate into the silicon carbide substrate after implanting the at least one of H, He or Ar.

18. The method according to claim 14, comprising:
forming a gate trench extending from a main surface of the silicon carbide substrate into the silicon carbide substrate;
implanting at least one of hydrogen (H), helium (He) or argon (Ar) after forming the gate trench; and
forming a gate dielectric layer along a sidewall of the gate trench after implanting the at least one of H, He or Ar.

19. The method according to claim 14, comprising:
forming a first metal layer on a main surface of the silicon carbide substrate;
implanting at least one of hydrogen (H), helium (He) or argon (Ar) after forming the first metal layer; and
forming a second metal layer on the first metal layer after implanting the at least one of H, He or Ar.

20. The method according to claim 14, comprising:
forming a second metal layer on a main surface of the silicon carbide substrate; and
implanting at least one of hydrogen (H), helium (He) or argon (Ar) after forming the second metal layer.

* * * * *